US012718122B2

(12) United States Patent
Zur et al.

(10) Patent No.: US 12,718,122 B2
(45) Date of Patent: Aug. 25, 2026

(54) PREDICTION-ASSISTED SAMPLING CIRCUITRY

(71) Applicant: Intel Corporation, Santa Clara, CA (US)

(72) Inventors: Sarit Zur, Petah-Tikva (IL); Oren Ezra Avraham, Givat Shmuel (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/897,306

(22) Filed: Aug. 29, 2022

(65) Prior Publication Data

US 2024/0070490 A1 Feb. 29, 2024

(51) Int. Cl.

| | |
|---|---|
| ***G06N 5/04*** | (2023.01) |
| *H03M 1/06* | (2006.01) |
| *H03M 1/12* | (2006.01) |

(52) U.S. Cl.

CPC ................ *G06N 5/04* (2013.01); *H03M 1/06* (2013.01); *H03M 1/12* (2013.01)

(58) Field of Classification Search

CPC ............ G06N 5/04; H03M 1/12; H03M 1/06

See application file for complete search history.

(56) References Cited

U.S. PATENT DOCUMENTS

| | | | | |
|---|---|---|---|---|
| 2010/0262420 A1* | 10/2010 | Herre | ...................... | G10L 19/20 704/201 |
| 2020/0359049 A1* | 11/2020 | Zhao | ...................... | H04N 19/43 |

* cited by examiner

*Primary Examiner* — Joseph J Lauture

(74) *Attorney, Agent, or Firm* — Schwegman Lundberg & Woessner, P.A.

(57) ABSTRACT

An apparatus can include sampling circuitry and processing circuitry coupled to the sampling circuitry. The processing circuitry can predict a next sample of an input signal and determine a predicative portion of the next sample of the input signal. The processing circuitry can subtract the predicative portion from the input signal to determine a non-predicative portion of the input signal and provide the non-predicative portion to the sampling circuitry for sampling.

17 Claims, 15 Drawing Sheets

200
215 Radio Front end Module
215 Radio Front end Module
245 GPS Receiver
210 Baseband Sub-System
235 Network Controller
240
250 User Interface
205 Application Processor
225 PMIC
230 Power
220 Memory 845A
850A
845B
850B
845N
802
Accelerator Sub-System
Buffer Memory
Accelerator Sub-System
Buffer Memory
Accelerator Sub-System
835
Interconnect Sub-System
815
820
840
825
Shared Memory Sub-System
Digital I/O Sub-System
Controller Sub-System
Digital Baseband Interface Sub-System

PREDICTION-ASSISTED SAMPLING CIRCUITRY

TECHNICAL FIELD

Aspects of the disclosure pertain to radio frequency (RF) communications. More particularly, aspects relate to dynamic range and sampling rate of sampling circuitry in a communications device.

BACKGROUND

Successive-approximation analog-to-digital converters (SAR ADCs) have an inherent tradeoff between dynamic range (DR) and sampling rate. As such, some SAR ADCs may not be able to implement a sufficient sampling rate over a sufficiently large DR to accommodate many common communication scenarios. Therefore, there is a general need to maintain sufficient sampling rate in ADCs over a large dynamic range.

BRIEF DESCRIPTION OF THE DRAWINGS

In the drawings, which are not necessarily drawn to scale, like numerals may describe similar components in different views. Like numerals having different letter suffixes may represent different instances of similar components. Some aspects are illustrated by way of example, and not limitation, in the figures of the accompanying drawings in which.

DETAILED DESCRIPTION

The following description and the drawings sufficiently illustrate specific aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

Communications systems are often called upon to operate in high interference conditions. Receivers for such systems typically use successive-approximation analog-to-digital converters (SAR ADCs) but SAR ADCs have an inherent tradeoff between dynamic range (DR) and sampling rate. For example, some communications scenarios require both a high sampling rate and a high DR, thus stretching or even exceeding the capabilities of the SAR ADC. For example, cellular and WiFi receivers may be called upon to demodulate a weak desired signal in the presence of a strong blocker, which relies on both high DR and high sampling rate. In at least another scenario, a loopback receiver may calibrate transmission nonlinearities, where the transmission signal itself acts as a blocker, while the weak nonlinear artifacts are the desired signal. Radar applications, for example millimeter-wave applications, are characterized by having a transmission signal that couples directly into the receiver, serving as a blocker for the weak desired signal reflected from a distant or small target. These radar applications can therefore also require high DR simultaneously with a high sampling rate.

Currently-available solutions may attempt to meet high DR and sampling rate needs by interleaving, or combining the output of several ADC cores, thus maintaining the same DR as each core, but at a higher sampling rate. However, these solutions can increase board layout area for communications systems, and can increase costs and power consumption for communications systems.

To address these and other concerns, some aspects of this disclosure provide an SAR ADC design that leverages a prediction algorithm to reduce the dynamic range of an input signal prior to sampling, thus allowing the SAR ADC to support a high DR requirement without adding additional ADC cores.

Figure 1A:
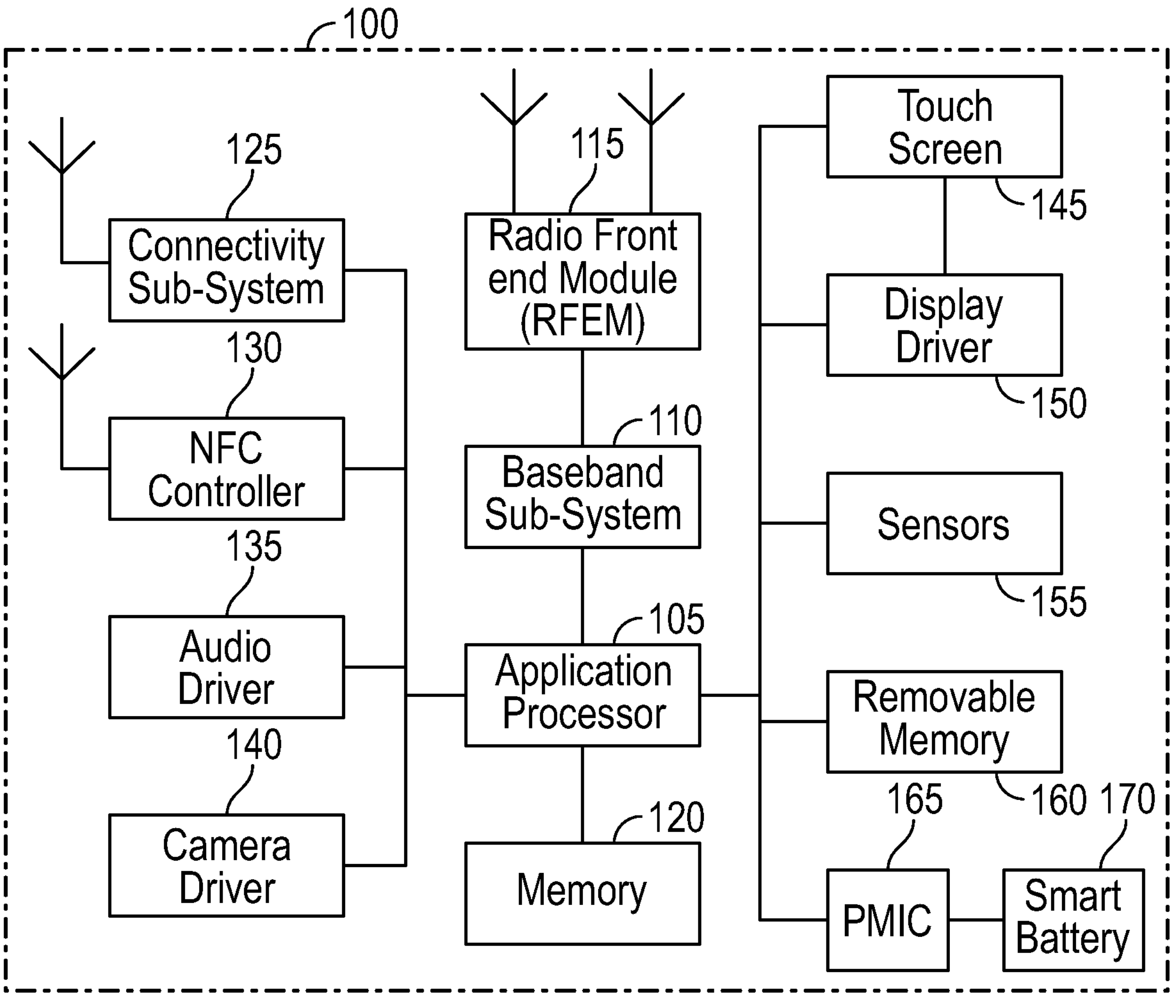
FIG. 1A illustrates an exemplary user device according to some aspects.

ADCs according to aspects of the disclosure can be used in cellular handsets or other wireless devices. FIG. 1A illustrates an exemplary user device according to some aspects. The user device 100 may be a mobile device in some aspects and includes an application processor 105, baseband processor 110 (also referred to as a baseband sub-system), radio front end module (RFEM) 115, memory

120, connectivity sub-system 125, near field communication (NFC) controller 130, audio driver 135, camera driver 140, touch screen 145, display driver 150, sensors 155, removable memory 160, power management integrated circuit (PMIC) 165, and smart battery 170.

In some aspects, application processor 105 may include, for example, one or more central processing unit (CPU) cores and one or more of cache memory, low drop-out voltage regulators (LDOs), interrupt controllers, serial interfaces such as SPI, I2C or universal programmable serial interface sub-system, real time clock (RTC), timer-counters including interval and watchdog timers, general purpose IO, memory card controllers such as SD/MMC or similar, USB interfaces, MIPI interfaces, and/or Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module including two or more integrated circuits.

Applications of mmWave technology can include, for example, WiGig and future 5G, but the mmWave technology can be applicable to a variety of telecommunications systems. The mmWave technology can be especially attractive for short-range telecommunications systems. WiGig devices operate in the unlicensed 60 GHz band, whereas 5G mmWave is expected to operate initially in the licensed 28 GHz and 39 GHz bands. A block diagram of an example baseband processor 110 and RFEM 115 in a mmWave system is shown in FIG. 1B.

Figure 1B:
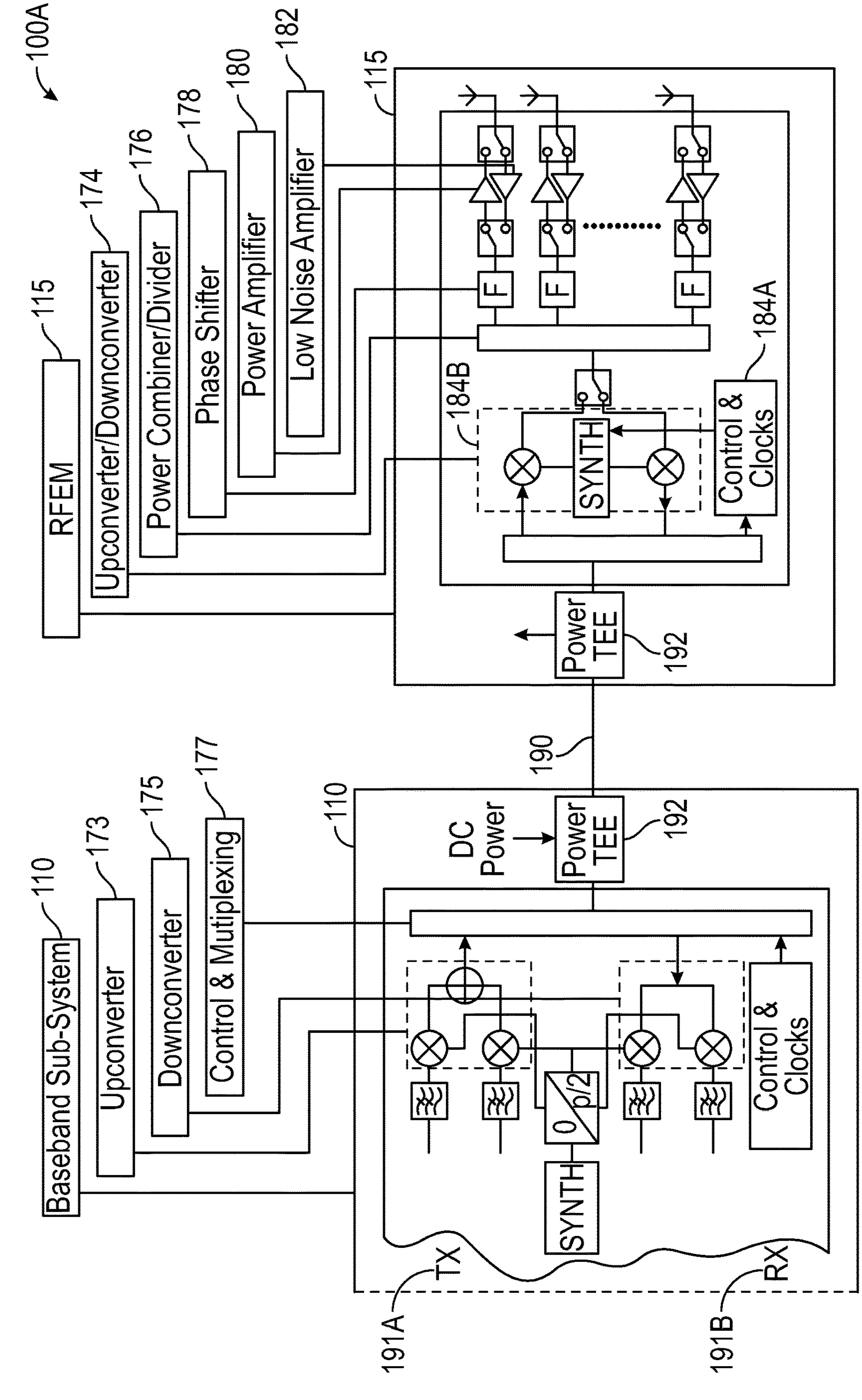
FIG. 1B illustrates a mmWave system, which can be used in connection with the device of FIG. 1A according to some aspects.

FIG. 1B illustrates a mmWave system 100A, which can be used in connection with the device 100 of FIG. 1A according to some aspects of the present disclosure. The system 100A includes two components: a baseband processor 110 and one or more radio front end modules (RFEMs) 115. The RFEM 115 can be connected to the baseband processor 110 by a single coaxial cable 190, which supplies a modulated intermediate frequency (IF) signal, DC power, clocking signals and control signals.

The baseband processor 110 is not shown in its entirety, but FIG. 1B rather shows an implementation of analog front end. This includes a transmitter (TX) section 191A with an upconverter 173 to intermediate frequency (IF) (around 10 GHz in current implementations), a receiver (RX) section 191B with downconversion 175 from IF to baseband, control and multiplexing circuitry 177 including a combiner to multiplex/demultiplex transmit and receive signals onto a single cable 190. In addition, power tee circuitry 192 (which includes discrete components) is included on the baseband circuit board to provide DC power for the RFEM 115. In some aspects, the combination of the TX section and RX section may be referred to as a transceiver, to which may be coupled one or more antennas or antenna arrays of the types described herein.

The RFEM 115 can be a small circuit board including a number of printed antennas and one or more RF devices containing multiple radio chains, including upconversion/downconversion 174 to millimeter wave frequencies, power combiner/divider 176, programmable phase shifting 178 and power amplifiers (PA) 180, low noise amplifiers (LNA) 182, as well as control and power management circuitry 184A and 184B. This arrangement can be different from Wi-Fi or cellular implementations, which generally have all RF and baseband functionality integrated into a single unit and only antennas connected remotely via coaxial cables.

This architectural difference can be driven by the very large power losses in coaxial cables at millimeter wave frequencies. These power losses can reduce the transmit power at the antenna and reduce receive sensitivity. In order to avoid this issue, in some aspects, PAs 180 and LNAs 182 may be moved to the RFEM 115 with integrated antennas. In addition, the RFEM 115 may include upconversion/downconversion 174 so that the IF signals over the coaxial cable 190 can be at a lower frequency. Additional system context for mmWave 5G apparatuses, techniques and features is discussed herein below.

Figure 2:
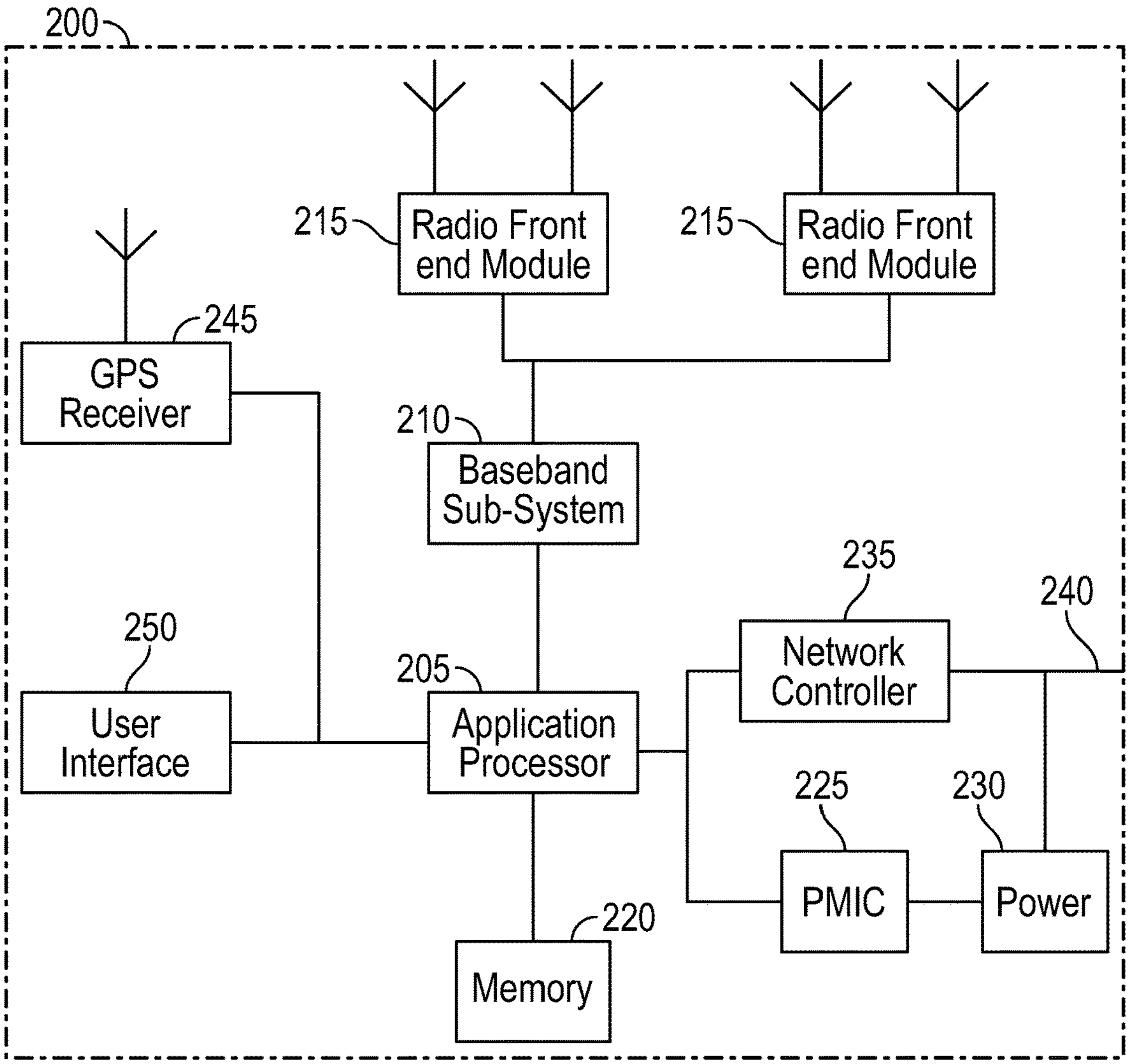
FIG. 2 illustrates an exemplary base station radio head according to some aspects.

FIG. 2 illustrates an exemplary base station or infrastructure equipment radio head according to some aspects. The base station radio head 200 may include one or more of application processor 205, baseband processors 210, one or more radio front end modules 215, memory 220, power management integrated circuitry (PMIC) 225, power tee circuitry 230, network controller 235, network interface connector 240, satellite navigation receiver (e.g., GPS receiver) 245, and user interface 250.

In some aspects, application processor 205 may include one or more CPU cores and one or more of cache memory, low drop-out voltage regulators (LDOs), interrupt controllers, serial interfaces such as SPI, I2C or universal programmable serial interface, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip sub-system including two or more integrated circuits.

In some aspects, memory 220 may include one or more of volatile memory including dynamic random access memory (DRAM) and/or synchronous DRAM (SDRAM), and nonvolatile memory (NVM) including high-speed electrically erasable memory (commonly referred to as Flash memory), phase-change random access memory (PRAM), magnetoresistive random access memory (MRAM), and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable. Power tee circuitry 230 may provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide, to application processor 205, data which may include one or more of position data or time data. Time data may be used by application processor 205 to synchronize operations with other radio base stations or infrastructure equipment.

In some aspects, user interface 250 may include one or more of buttons. The buttons may include a reset button. User interface 250 may also include one or more indicators such as LEDs and a display screen.

Figure 3A:
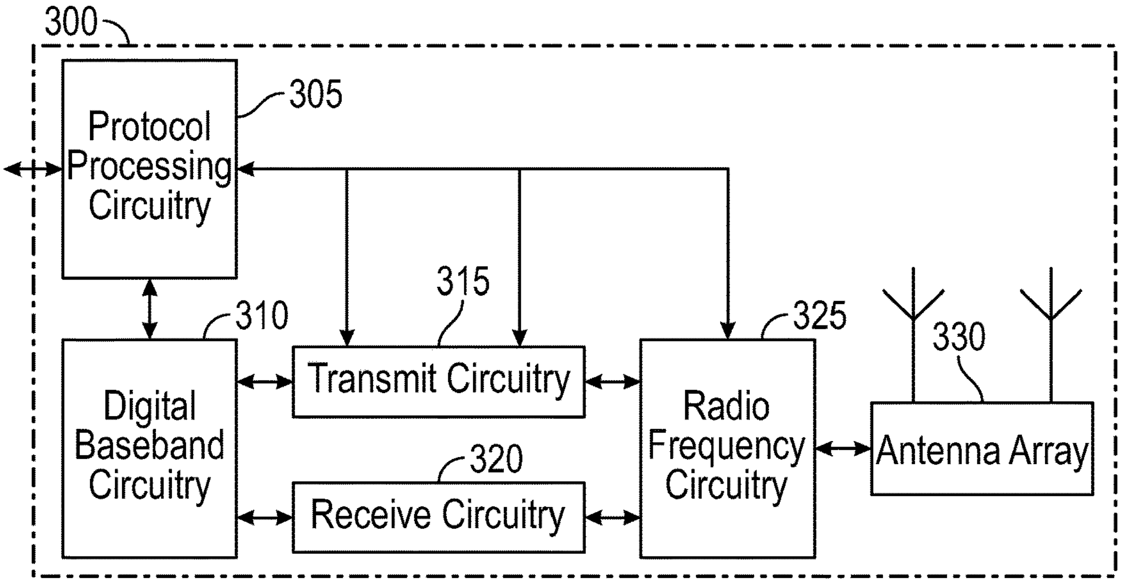
FIG. 3A illustrates exemplary wireless communication circuitry according to some aspects.
Figure 3B:
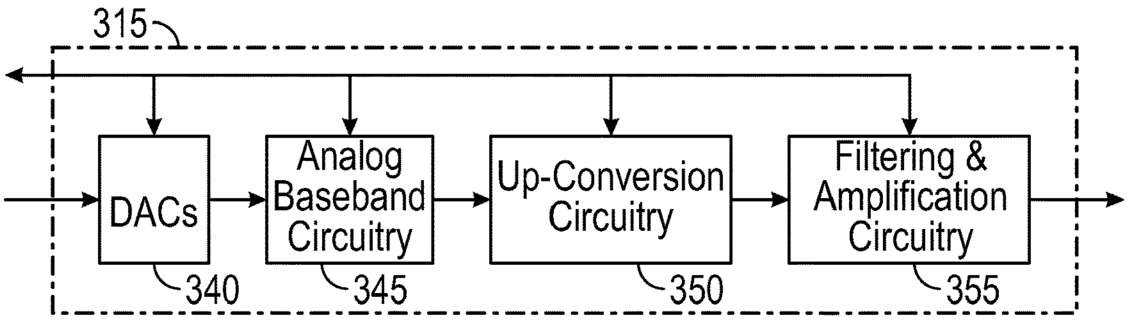
FIG. 3B illustrates aspects of exemplary transmit circuitry illustrated in FIG. 3A according to some aspects.
Figure 3C:
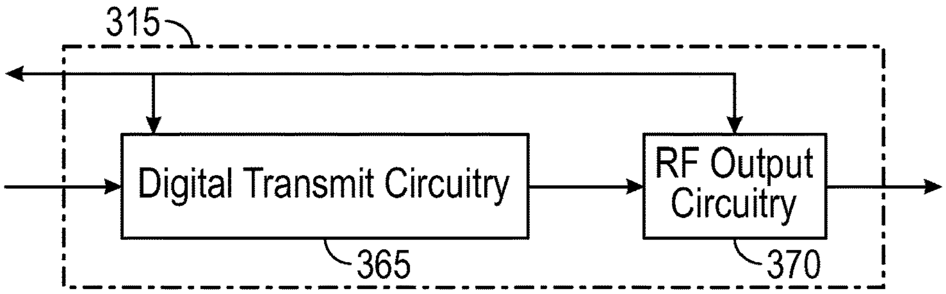
FIG. 3C illustrates aspects of exemplary transmit circuitry illustrated in FIG. 3A according to some aspects.
Figure 3D:
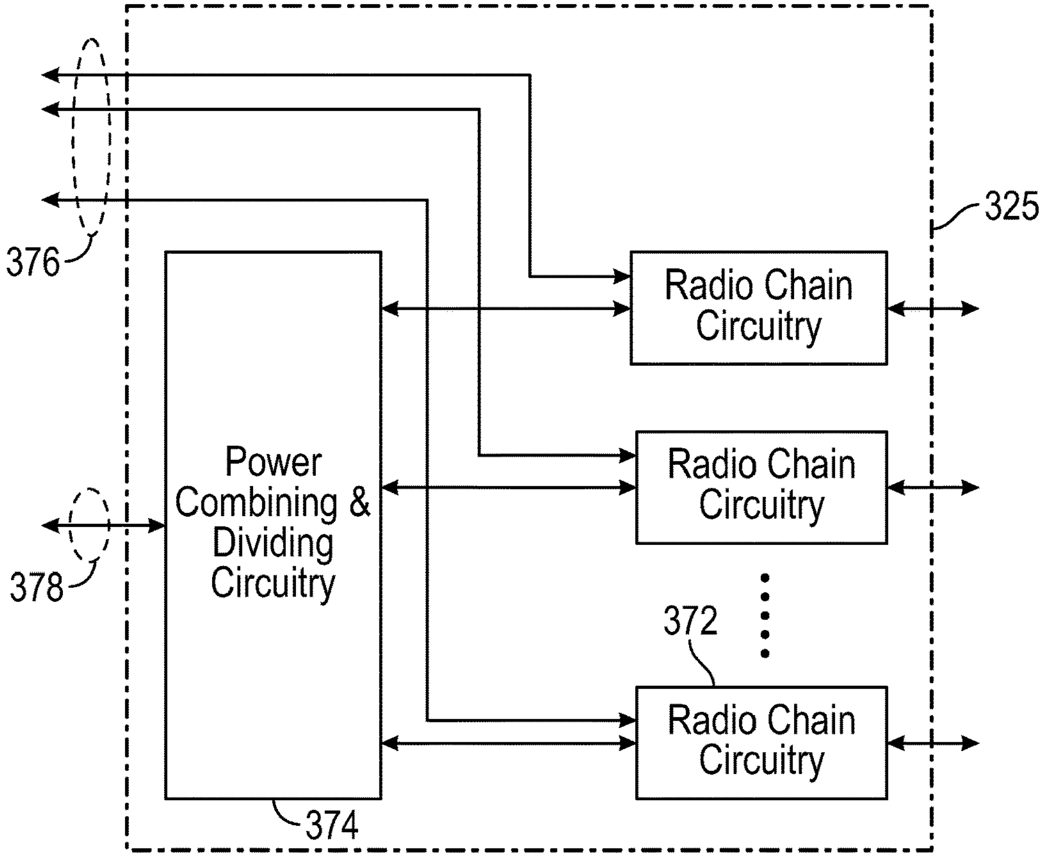
FIG. 3D illustrates aspects of exemplary radio frequency circuitry illustrated in FIG. 3A according to some aspects.
Figure 3E:
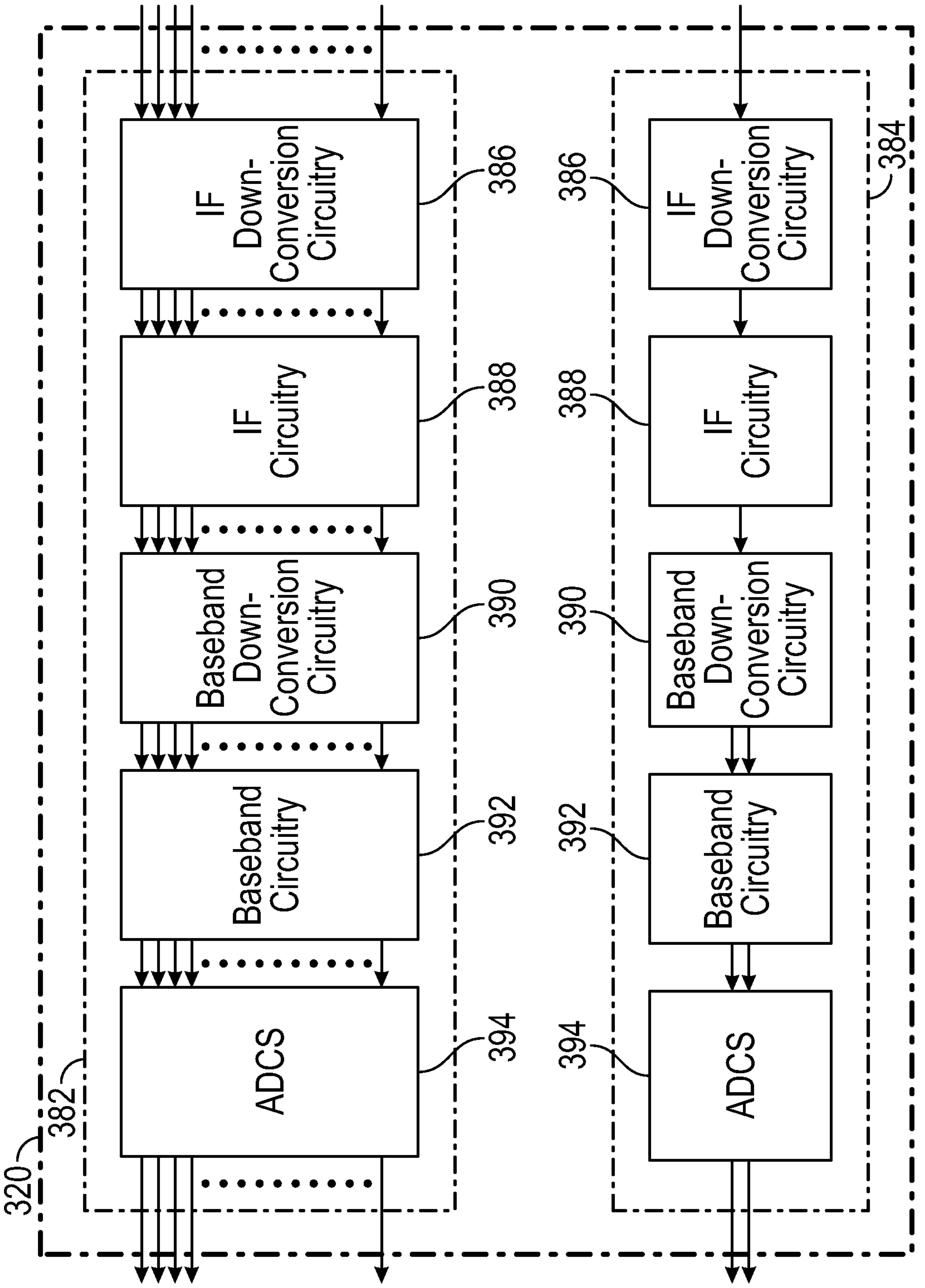
FIG. 3E illustrates aspects of exemplary receive circuitry in FIG. 3A according to some aspects.

FIG. 3A illustrates exemplary wireless communication circuitry according to some aspects; FIGS. 3B and 3C illustrate aspects of transmit circuitry shown in FIG. 3A according to some aspects; FIG. 3D illustrates aspects of radio frequency circuitry shown in FIG. 3A according to some aspects; FIG. 3E illustrates aspects of receive circuitry in FIG. 3A according to some aspects. Wireless communication circuitry 300 shown in FIG. 3A may be alternatively grouped according to functions. Components illustrated in FIG. 3A are provided here for illustrative purposes and may include other components not shown in FIG. 3A.

Wireless communication circuitry 300 may include protocol processing circuitry 305 (or processor) or other means for processing. Protocol processing circuitry 305 may implement one or more of medium access control (MAC), radio link control (RLC), packet data convergence protocol (PDCP), radio resource control (RRC) and non-access stratum (NAS) functions, among others. Protocol processing circuitry 305 may include one or more processing cores to execute instructions and one or more memory structures to store program and data information.

Wireless communication circuitry 300 may further include digital baseband circuitry 310. Digital baseband circuitry 310 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Wireless communication circuitry 300 may further include transmit circuitry 315, receive circuitry 320 and/or antenna array circuitry 330. Wireless communication circuitry 300 may further include RF circuitry 325. In some aspects, RF circuitry 325 may include one or multiple parallel RF chains for transmission and/or reception. Each of the RF chains may be connected to one or more antennas of antenna array circuitry 330.

In some aspects, protocol processing circuitry 305 may include one or more instances of control circuitry. The control circuitry may provide control functions for one or more of digital baseband circuitry 310, transmit circuitry 315, receive circuitry 320, and/or RF circuitry 325.

FIGS. 3B and 3C illustrate aspects of transmit circuitry shown in FIG. 3A according to some aspects. Transmit circuitry 315 shown in FIG. 3B may include one or more of digital to analog converters (DACs) 340, analog baseband circuitry 345, up-conversion circuitry 350 and/or filtering and amplification circuitry 355. DACs 340 may convert digital signals into analog signals. Analog baseband circuitry 345 may perform multiple functions as indicated below. Up-conversion circuitry 350 may up-convert baseband signals from analog baseband circuitry 345 to RF frequencies (e.g., mmWave frequencies). Filtering and amplification circuitry 355 may filter and amplify analog signals. Control signals may be supplied between protocol processing circuitry 305 and one or more of DACs 340, analog baseband circuitry 345, up-conversion circuitry 350 and/or filtering and amplification circuitry 355.

Transmit circuitry 315 shown in FIG. 3C may include digital transmit circuitry 365 and RF circuitry 370. In some aspects, signals from filtering and amplification circuitry 355 may be provided to digital transmit circuitry 365. As above, control signals may be supplied between protocol processing circuitry 305 and one or more of digital transmit circuitry 365 and RF circuitry 370.

FIG. 3D illustrates aspects of radio frequency circuitry shown in FIG. 3A according to some aspects. Radio frequency circuitry 325 may include one or more instances of radio chain circuitry 372, which in some aspects may include one or more filters, power amplifiers, low noise amplifiers, programmable phase shifters and power supplies.

Radio frequency circuitry 325 may also in some aspects include power combining and dividing circuitry 374. In some aspects, power combining and dividing circuitry 374 may operate bidirectionally, such that the same physical circuitry may be configured to operate as a power divider when the device is transmitting, and as a power combiner when the device is receiving. In some aspects, power combining and dividing circuitry 374 may include one or more wholly or partially separate circuitries to perform power dividing when the device is transmitting and power combining when the device is receiving. In some aspects, power combining and dividing circuitry 374 may include passive circuitry including one or more two-way power divider/combiners arranged in a tree. In some aspects, power combining and dividing circuitry 374 may include active circuitry including amplifier circuits.

In some aspects, radio frequency circuitry 325 may connect to transmit circuitry 315 and receive circuitry 320 in FIG. 3A. Radio frequency circuitry 325 may connect to transmit circuitry 315 and receive circuitry 320 via one or more radio chain interfaces 376 and/or a combined radio chain interface 378. In some aspects, one or more radio chain interfaces 376 may provide one or more interfaces to one or more receive or transmit signals, each associated with a single antenna structure. In some aspects, the combined radio chain interface 378 may provide a single interface to one or more receive or transmit signals, each associated with a group of antenna structures.

FIG. 3E illustrates aspects of receive circuitry in FIG. 3A according to some aspects. Receive circuitry 320 may include one or more of parallel receive circuitry 382 and/or one or more of combined receive circuitry 384. In some aspects, the one or more parallel receive circuitry 382 and one or more combined receive circuitry 384 may include one or more Intermediate Frequency (IF) down-conversion circuitry 386, IF processing circuitry 388, baseband down-conversion circuitry 390, baseband processing circuitry 392 and analog-to-digital converter (ADC) circuitry 394. As used herein, the term "intermediate frequency" refers to a frequency to which a carrier frequency (or a frequency signal) is shifted as in intermediate step in transmission, reception, and/or signal processing. IF down-conversion circuitry 386 may convert received RF signals to IF. IF processing circuitry 388 may process the IF signals, e.g., via filtering and amplification. Baseband down-conversion circuitry 390 may convert the signals from IF processing circuitry 388 to baseband. Baseband processing circuitry 392 may process the baseband signals, e.g., via filtering and amplification. ADC circuitry 394 may convert the processed analog baseband signals to digital signals.

Figure 4:
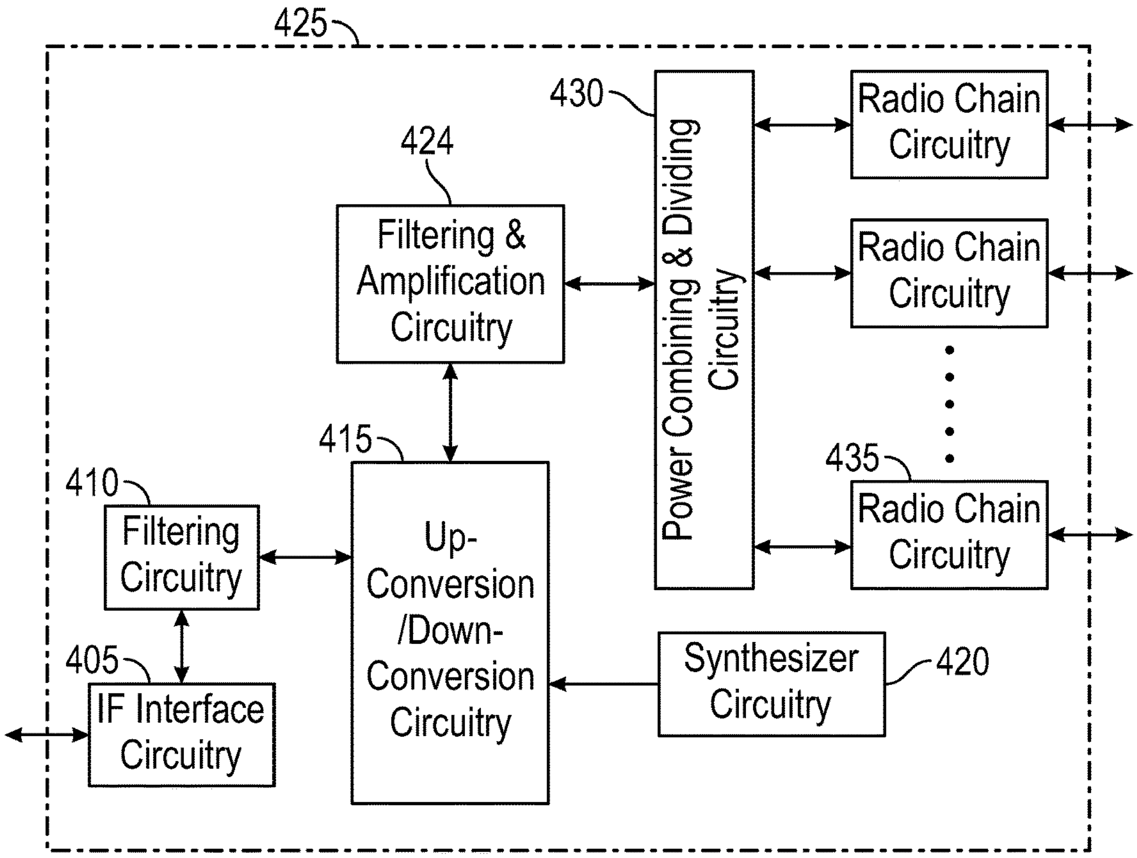
FIG. 4 illustrates exemplary useable RF circuitry in FIG. 3A according to some aspects.

FIG. 4 illustrates exemplary RF circuitry of FIG. 3A according to some aspects. In an aspect, RF circuitry 325 in FIG. 3A (depicted in FIG. 4 using reference number 425) may include one or more of the IF interface circuitry 405, filtering circuitry 410, up-conversion and down-conversion circuitry 415, synthesizer circuitry 420, filtering and amplification circuitry 424, power combining and dividing circuitry 430, and radio chain circuitry 435.

Figure 5A:
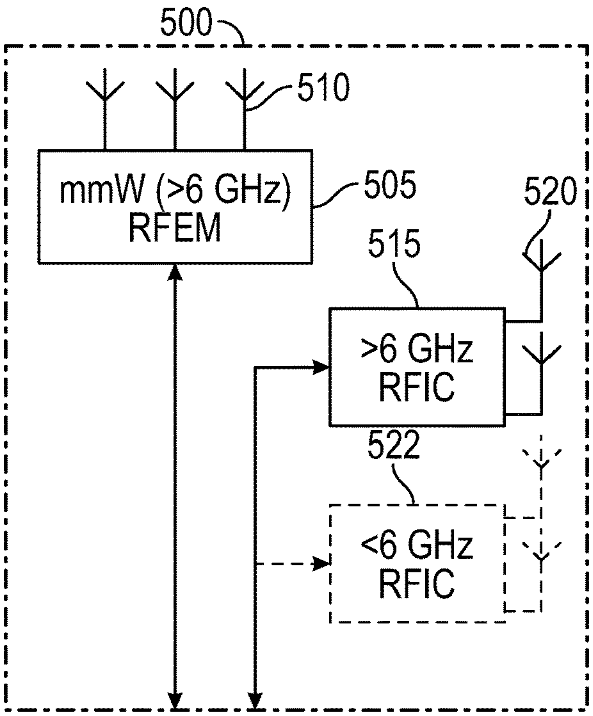
FIG. 5A illustrates an aspect of an exemplary radio front end module (RFEM) according to some aspects.
Figure 5B:
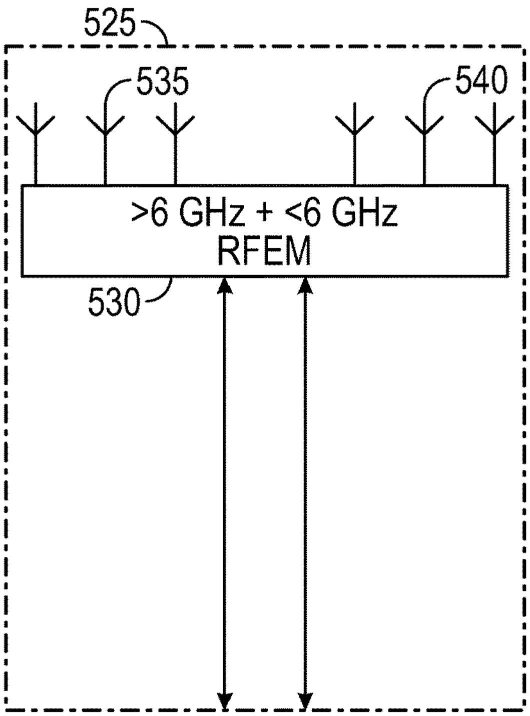
FIG. 5B illustrates an alternate aspect of an exemplary radio front end module, according to some aspects.

FIG. 5A and FIG. 5B illustrate aspects of a radio front-end module (RFEM) useable in the circuitry shown in FIG. 1A, FIG. 1B and FIG. 2, according to some aspects. FIG. 5A illustrates an aspect of a RFEM according to some aspects. RFEM 500 incorporates a millimeter wave RFEM 505 and one or more above-six gigahertz radio frequency integrated circuits (RFIC) 515 and/or one or more sub-six gigahertz RFICs 522. In this aspect, the one or more sub-six gigahertz RFICs 515 and/or one or more sub-six gigahertz RFICs 522 may be physically separated from millimeter wave RFEM 505. RFICs 515 and 522 may include connection to one or more antennas 520. RFEM 505 may include multiple antennas 510.

FIG. 5B illustrates an alternate aspect of a radio front end module 525, according to some aspects. In this aspect both millimeter wave and sub-six gigahertz radio functions may be implemented in the same physical radio front end module (RFEM) 530. RFEM 530 may incorporate both millimeter wave antennas 535 and sub-six gigahertz antennas 540.

Figure 6:
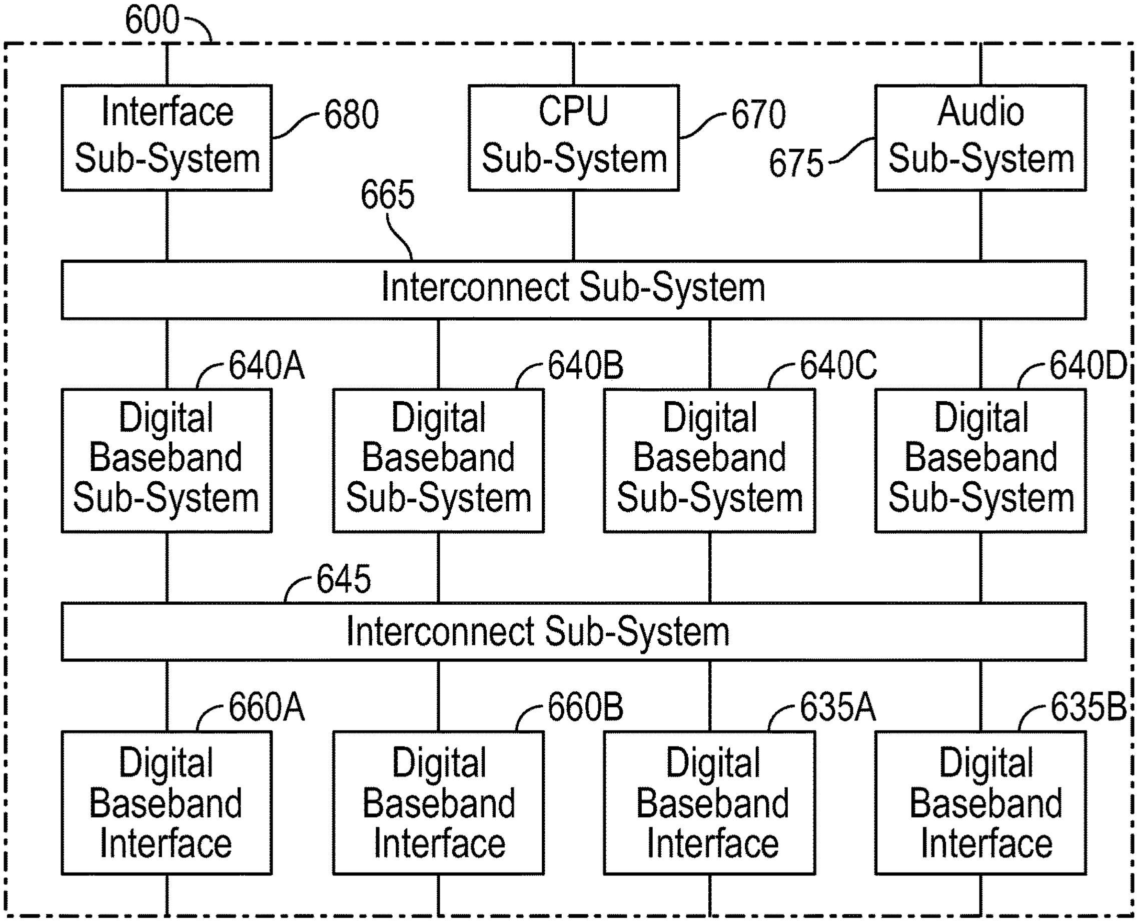
FIG. 6 illustrates an exemplary multi-protocol baseband processor useable in FIG. 1A, FIG. 1B or FIG. 2, according to some aspects.

FIG. 6 illustrates a multi-protocol baseband processor 600 useable in the system and circuitry shown in FIG. 1A, FIG. 1B or FIG. 2, according to some aspects. In an aspect, baseband processor may contain one or more digital baseband subsystems 640A, 640B, 640C, 640D, also herein referred to collectively as digital baseband subsystems.

In an aspect, the one or more digital baseband subsystems 640A, 640B, 640C, 640D may be coupled via interconnect subsystem 665 to one or more of CPU subsystem 670, audio subsystem 675 and interface subsystem 680. In an aspect, the one or more digital baseband subsystems 640A, 640B, 640C, 640D may be coupled via interconnect subsystem 645 to one or more of each of digital baseband interface 660A, 660B and mixed-signal baseband subsystem 635A, 635B.

In an aspect, interconnect subsystem 665 and 645 may each include one or more of each of buses point-to-point connections and network-on-chip (NOC) structures. In an aspect, audio subsystem 675 may include one or more of digital signal processing circuitry, buffer memory, program memory, speech processing accelerator circuitry, data converter circuitry such as analog-to-digital and digital-to-analog converter circuitry, and analog circuitry including one or more of amplifiers and filters.

Figure 7:
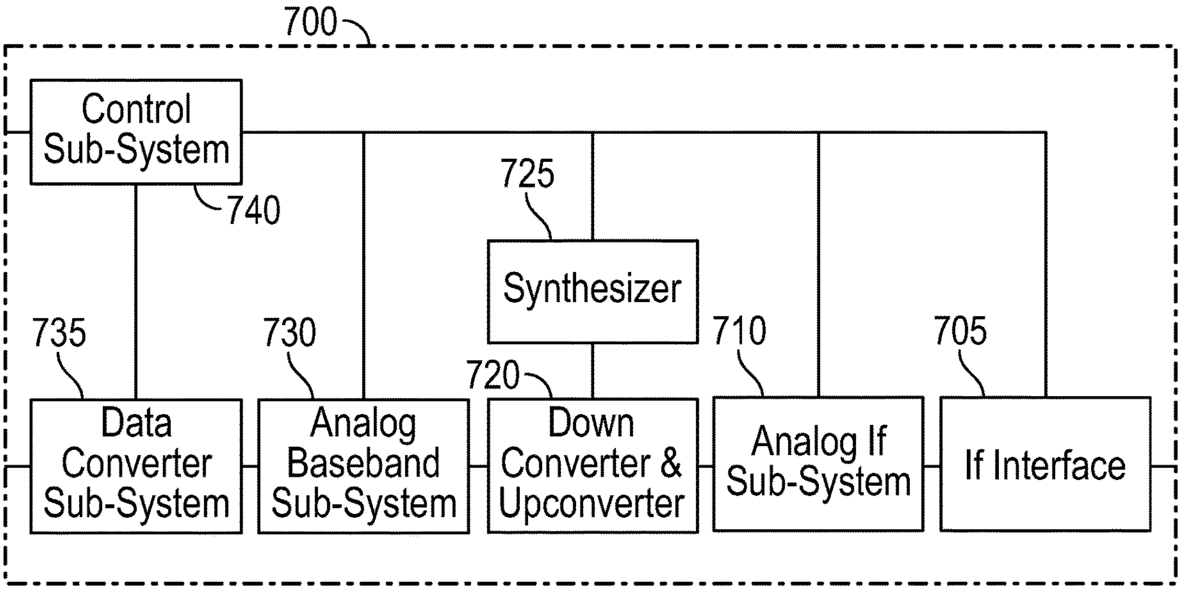
FIG. 7 illustrates an exemplary mixed signal baseband subsystem, according to some aspects.

FIG. 7 illustrates an exemplary of a mixed signal baseband subsystem 700, according to some aspects. In an aspect, mixed signal baseband subsystem 700 may include one or more of IF interface 705, analog IF subsystem 710, down-converter and up-converter subsystem 720, analog baseband subsystem 730, data converter subsystem 735, synthesizer 725 and control subsystem 740.

Figure 8A:
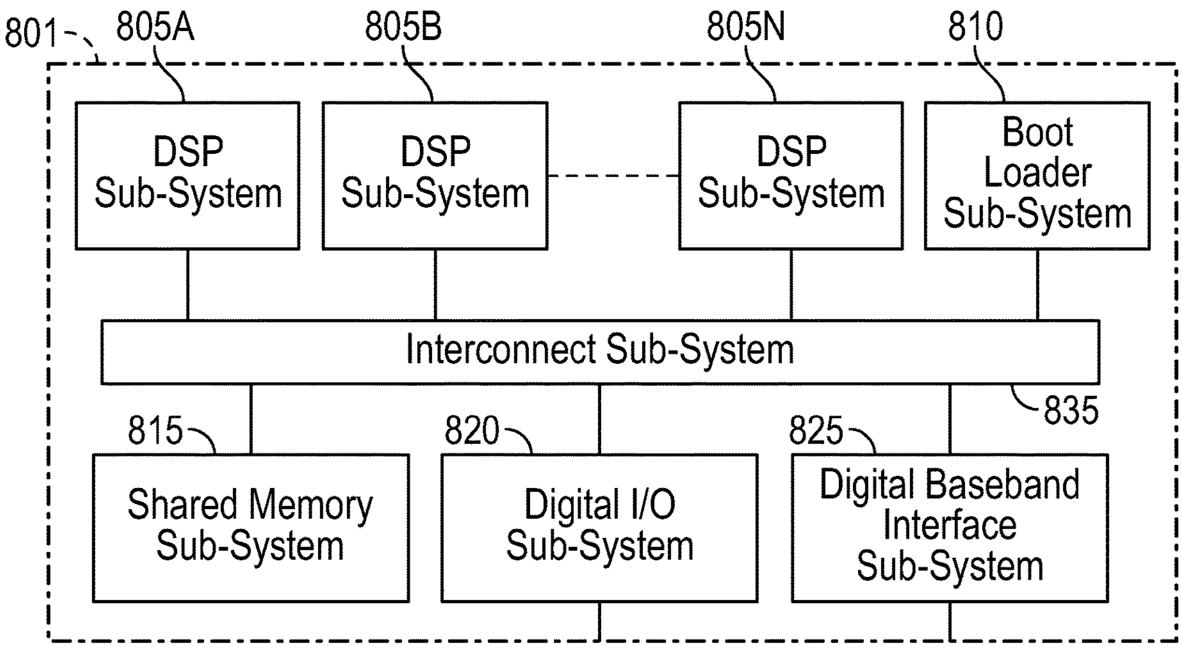
FIG. 8A illustrates an exemplary digital baseband subsystem, according to some aspects.
Figure 8B:
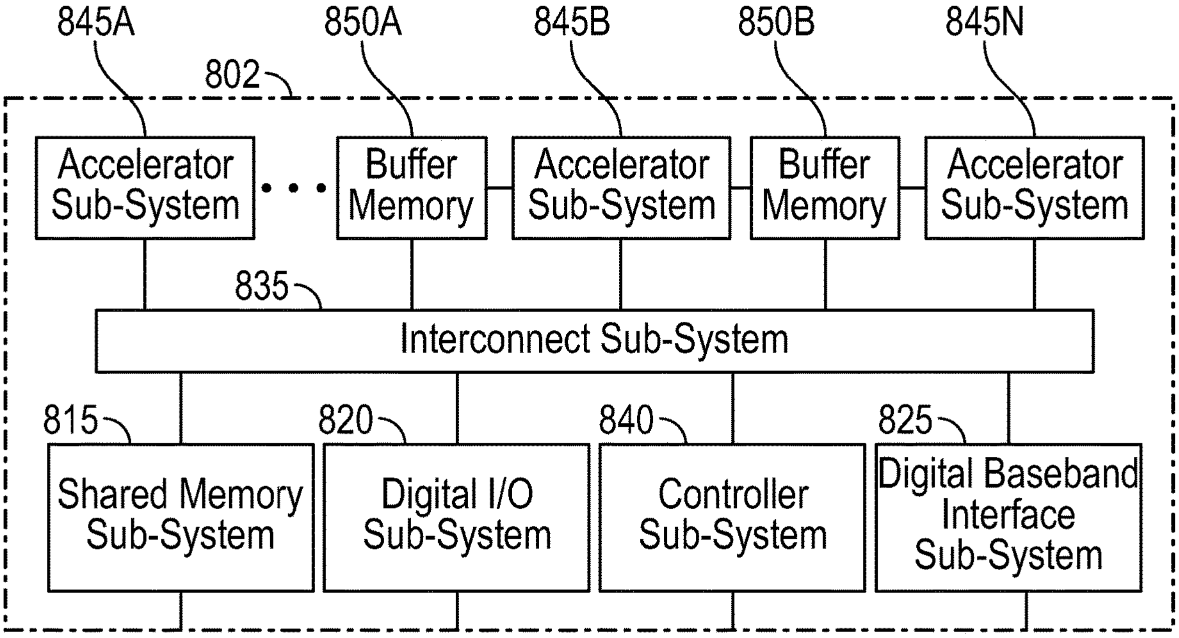
FIG. 8B illustrates an alternate aspect of an exemplary baseband processing subsystem, according to some aspects.

FIG. 8A illustrates a digital baseband processing subsystem 801, according to some aspects. FIG. 8B illustrates an alternate aspect of a digital baseband processing subsystem 802, according to some aspects.

In an aspect of FIG. 8A, the digital baseband processing subsystem 801 may include one or more of each of digital signal processor (DSP) subsystems 805A, 805B, . . . 805N, interconnect subsystem 835, boot loader subsystem 810, shared memory subsystem 815, digital I/O subsystem 820, and digital baseband interface subsystem 825.

In an aspect of FIG. 8B, digital baseband processing subsystem 802 may include one or more of each of accelerator subsystem 845A, 845B, . . . 845N, buffer memory 850A, 850B, . . . 850N, interconnect subsystem 835, shared memory subsystem 815, digital I/O subsystem 820, controller subsystem 840 and digital baseband interface subsystem 825.

In an aspect, boot loader subsystem 810 may include digital logic circuitry configured to perform configuration of the program memory and running state associated with each of the one or more DSP subsystems 805A, 805B, . . . 805N. Configuration of the program memory of each of the one or more DSP subsystems 805A, 805B, . . . 805N may include loading executable program code from storage external to digital baseband processing subsystems 801 and 802. Configuration of the running state associated with each of the one or more DSP subsystems 805A, 805B, . . . 805N may include one or more of the steps of: setting the state of at least one DSP core which may be incorporated into each of the one or more DSP subsystems 805A, 805B, . . . 805N to a state in which it is not running, and setting the state of at least one DSP core which may be incorporated into each of the one or more DSP subsystems 805A, 805B, . . . 805N into a state in which it begins executing program code starting from a predefined memory location.

In an aspect, shared memory subsystem 815 may include one or more of read-only memory (ROM), static random access memory (SRAM), embedded dynamic random access memory (eDRAM) and/or non-volatile random access memory (NVRAM).

In an aspect, digital I/O subsystem 820 may include one or more of serial interfaces such as Inter-Integrated Circuit (I2C), Serial Peripheral Interface (SPI) or other 1, 2 or 3-wire serial interfaces, parallel interfaces such as general-purpose input-output (GPIO), register access interfaces and direct memory access (DMA). In an aspect, a register access interface implemented in digital I/O subsystem 820 may permit a microprocessor core external to digital baseband processing subsystem 801 to read and/or write one or more of control and data registers and memory. In an aspect, DMA logic circuitry implemented in digital I/O subsystem 820 may permit transfer of contiguous blocks of data between memory locations including memory locations internal and external to digital baseband processing subsystem 801.

In an aspect, digital baseband interface subsystem 825 may provide for the transfer of digital baseband samples between baseband processing subsystem and mixed signal baseband or radio-frequency circuitry external to digital baseband processing subsystem 801. In an aspect, digital baseband samples transferred by digital baseband interface subsystem 825 may include in-phase and quadrature (I/Q) samples.

In an aspect, controller subsystem 840 may include one or more of each of control and status registers and control state machines. In an aspect, control and status registers may be accessed via a register interface and may provide for one or more of: starting and stopping operation of control state machines, resetting control state machines to a default state, configuring optional processing features, and/or configuring the generation of interrupts and reporting the status of operations. In an aspect, each of the one or more control state machines may control the sequence of operation of each of the one or more accelerator subsystems 845A, 845B . . . 845N. There may be examples of implementations of both FIG. 8A and FIG. 8B in the same baseband subsystem.

Figure 9:
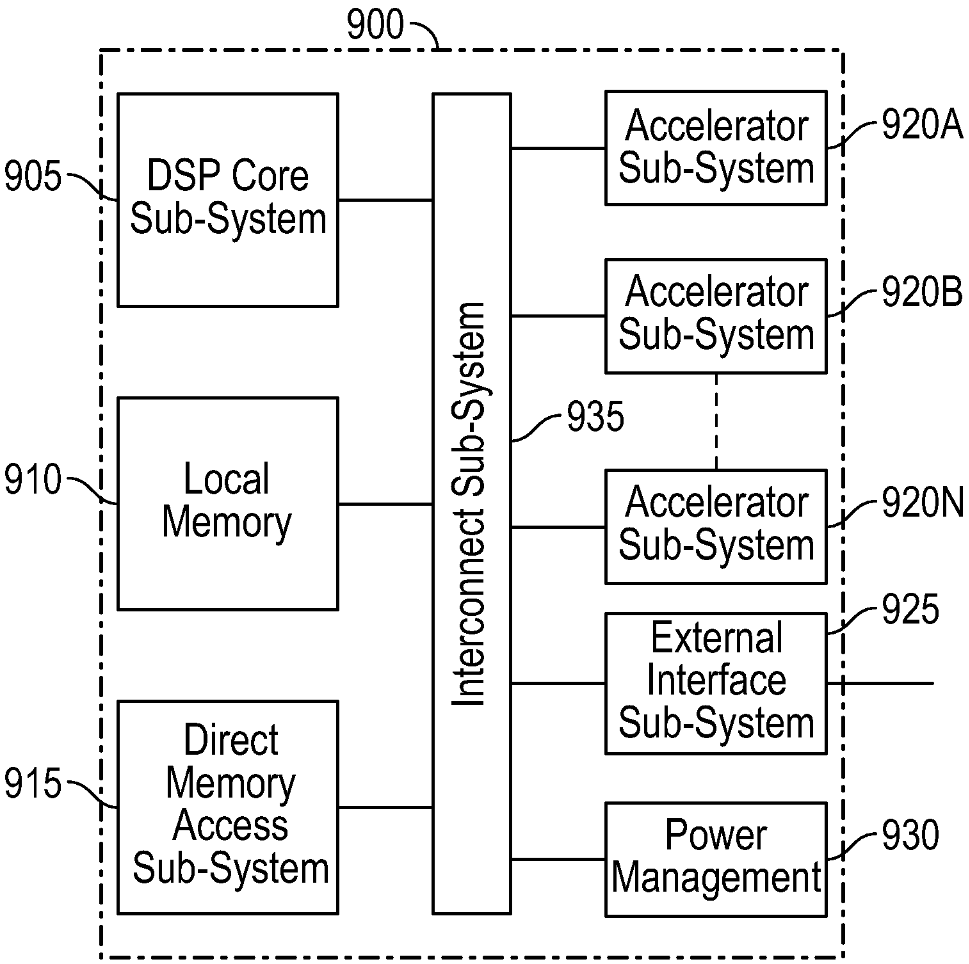
FIG. 9 illustrates an exemplary digital signal processor subsystem, according to some aspects.

FIG. 9 illustrates a digital signal processor (DSP) subsystem 900 according to some aspects. In an aspect, DSP subsystem 900 may include one or more of each of DSP core subsystem 905, local memory 910, direct memory access (DMA) subsystem 915, accelerator subsystem 920A, 920B . . . 920N, external interface subsystem 925, power management circuitry 930 and interconnect subsystem 935.

In an aspect, the local memory 910 may include one or more of each of read-only memory, static random access memory or embedded dynamic random access memory.

In an aspect, the DMA subsystem 915 may provide registers and control state machine circuitry adapted to transfer blocks of data between memory locations including memory locations internal and external to DSP subsystem 900.

In an aspect, external interface subsystem 925 may provide for access by a microprocessor system external to DSP subsystem 900 to one or more of memory, control registers and status registers which may be implemented in DSP subsystem 900. In an aspect, external interface subsystem 925 may provide for transfer of data between local memory 910 and storage external to DSP subsystem 900 under the control of one or more of the DMA subsystem 915 and the DSP core subsystem 905.

Prediction Assisted Sampling Circuitry

Figure 10:
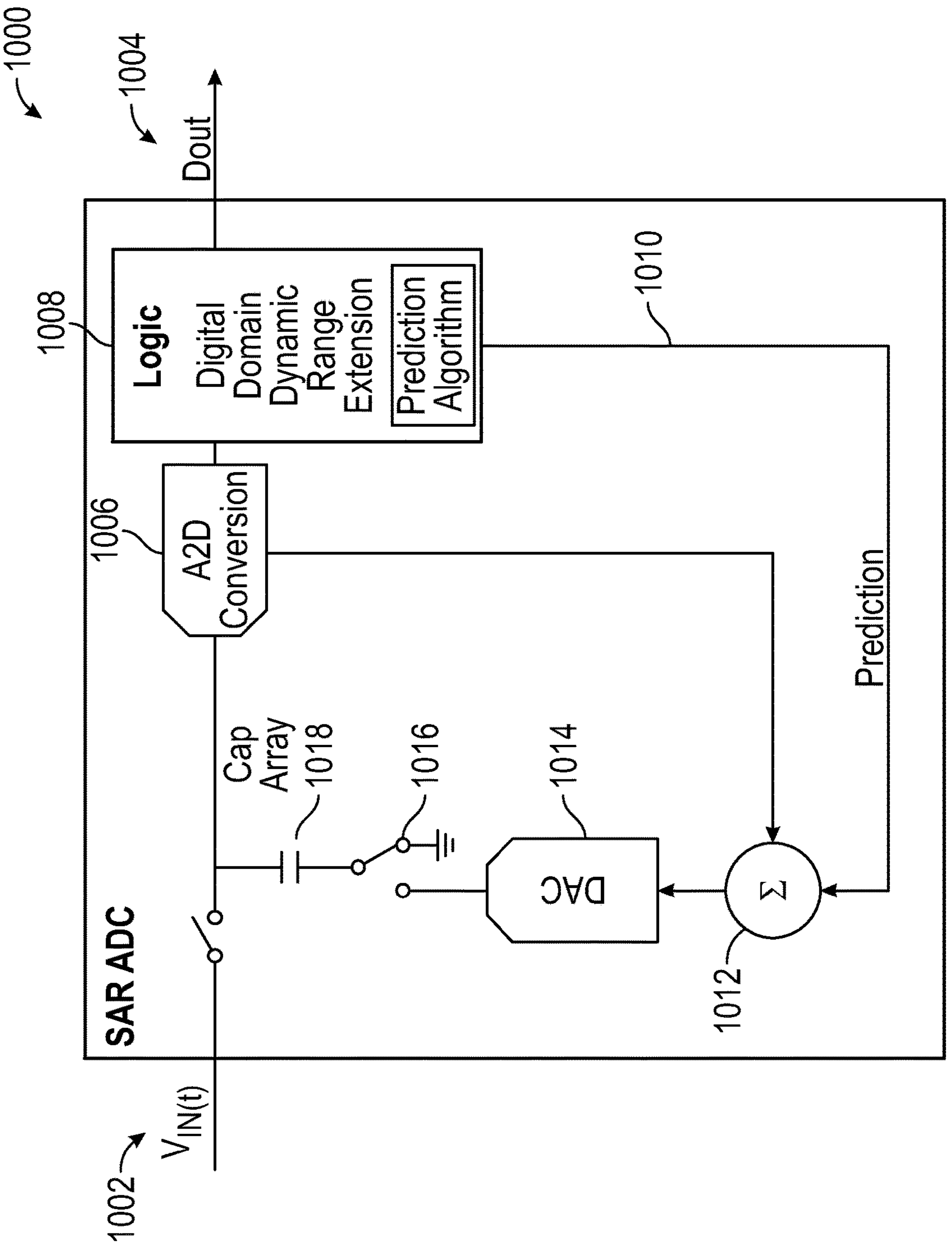
FIG. 10 illustrates an apparatus for prediction-assisted sampling according to some aspects.

FIG. 10 illustrates an apparatus 1000 for prediction-assisted sampling according to some aspects. The apparatus 1000 can be included in components of FIGS. 1-9; for example, the apparatus 1000 can be included in receiver circuitry, e.g., receiver circuitry 320 (FIG. 3A) as a portion or portions/of ADCs 394, etc. The apparatus 1000 can take as an input a signal 1002 to be sampled (e.g., an analog signal to be converted), and provide an output signal 1004 (e.g., a digital or converted signal).

The apparatus 1000 can include sampling circuitry 1006. In examples, the sampling circuitry 1006 converts an analog signal to a digital signal.

The apparatus 1000 further includes processing circuitry 1008 coupled to the sampling circuitry 1006. The processing circuitry 1008 can predict a next sample of an input signal 1002. Using the predicted next sample, the processing circuitry 1008 can determine a predicative portion 1010 of the next sample of the input signal 1002.

Since the input signal 1002 is oversampled by the sampling circuitry 1006, the input signal 1002 exhibits high correlation between successive samples. Therefore, each new sample can be represented as a sum of weighted history (predictive part) and new information (non-predicative part) according to Equation (1):

$$x(n) = \sum\nolimits_{m=1}^{M} p(m)x(n-m) + d(n) \quad (1)$$

where x(n) represents the input signal 1002, M is the number of prediction coefficients, p(m) are the predication coefficients within 1008, d(n) is the non-predicative portion that will be sampled by the sampling circuitry 1006, and $$\sum\nolimits_{m=1}^{M} p(m)x(n-m)$$

is the sum of the weighted history.

Because the input signal 1002 exhibits high correlation, the predictive part can be subtracted out from the analog input signal prior to sampling. Therefore, the processing circuitry 1008 can subtract the predicative portion 1010 from the input signal 1002 to determine a non-predicative portion of the input signal 1002. This allows the sampling circuitry 1006 to operate in a DR encompassing only the non-predicative portion d(n), which has a DR significantly lower than the DR of the complete input signal 1002 (x(n) in Equation (1)).

The processing circuitry 1008 can determine the non-predicative portion d(n) using optimal linear prediction according to Equation (2):

$$d(n) = x(n) - \sum\nolimits_{i=1}^{M} p(m)x(n-m) \quad (2)$$

where:

$$\bar{p} = \mathrm{argmin}\{E(|d(n)|^2)\} \quad (3)$$

the solution for which is:

$$\bar{p} = \begin{pmatrix} r(0) & \dots & R(M-1) \\ \dots & \dots & \dots \\ r(-M+1) & \dots & r(0) \end{pmatrix} \begin{pmatrix} r(1) \\ \dots \\ r(M) \end{pmatrix} \quad (4)$$

where:

$$r(i) = E(x(n)\times(n-i)^*) \quad (5)$$

Where r(i) is the autocorrelation of the input signal 1002 and E is expected value of the relevant signal (i.e., the input signal x(n) in Equation (5) or of the predicative portion in Equation (3).

Referring still to FIG. 10, The processing circuitry 1008 can then provide the non-predicative portion to the sampling circuitry 1006, after which the sampling circuitry 1006 can sample the non-predicative portion. By removing the predicative portion prior to sampling, the DR contributed by this predicative portion can be removed, thus reducing the DR of the signal that will be sampled.

Once the DR-reduced signal is sampled (i.e., once the non-predicative portion is sampled), the processing circuitry 1008 can reconstruct the complete signal 1004 by applying an inverse filter (stable IIR), on d(n) according to Equation (6):

$$x(n) = d(m) + \sum\nolimits_{i=1}^{M} p(m)x(n-m) \quad (6)$$

Or in the Z-domain according to Equation (7):

$$X(z) = \frac{D(z)}{1 - P(z)} \quad (7)$$

The loopback signal (e.g., predicative portion 1010) is routed to 1012, where it is summed together with the output of A2D converter (e.g., sampling circuitry 1006) according to standard SAR ADC operation. The combined signal is provided to the DAC 1014, which effectively subtracts the combined signal from the input signal 1002: when the switch 1016 is routed to the DAC 1014 this drives the signal from the summer 1012 to the bottom terminal of the capacitive array 1018, while the input signal 1002 drives the voltage at the upper terminal of the capacitive array 1018. The capacitive array 1018 is then charged to the voltage difference between the input signal 1002 and the feedback signal (e.g., output of the summer 1012).

Figure 11A:
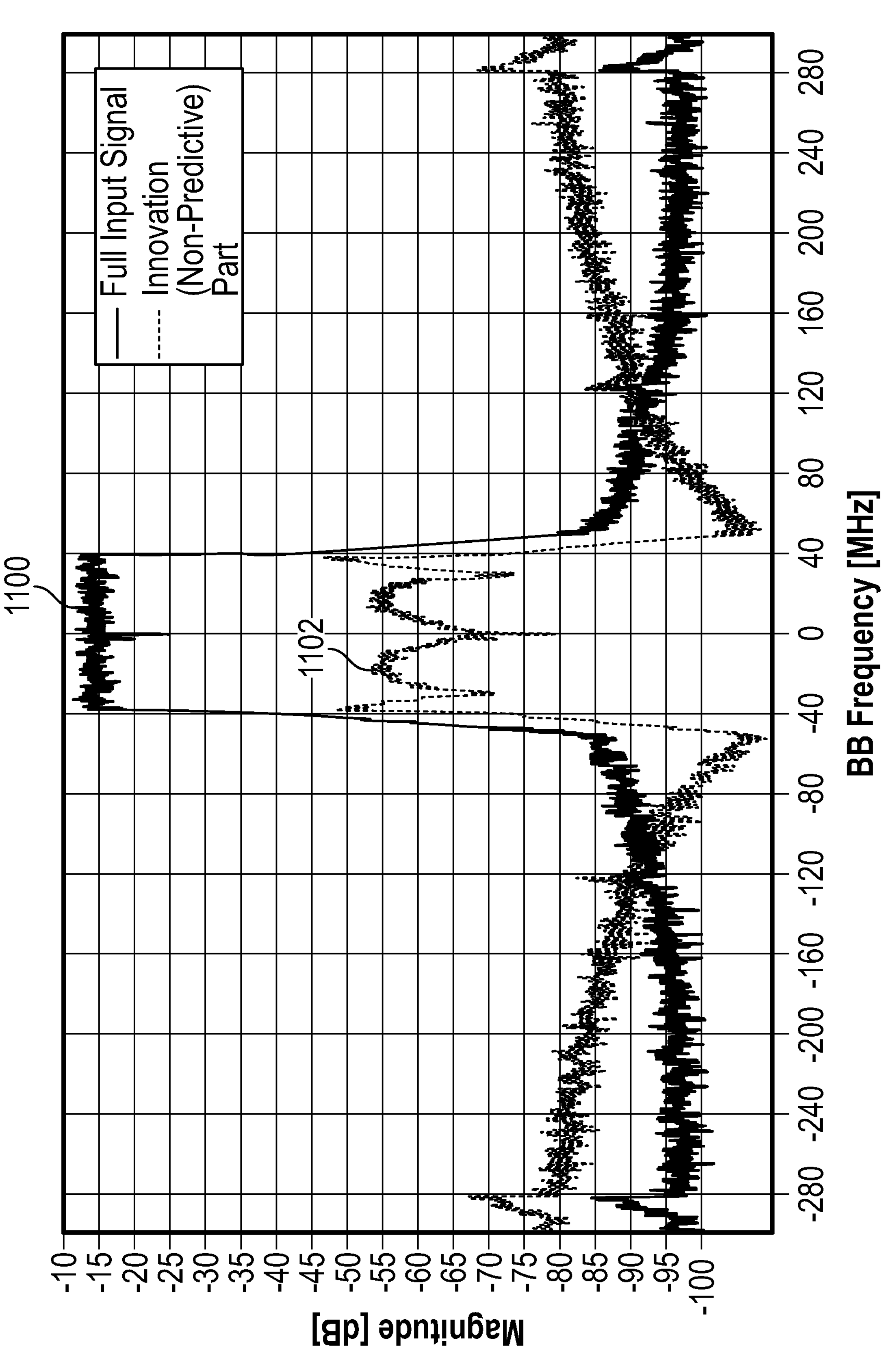
FIG. 11A represents a full input signal and non-predicative portion of the full input signal according to some aspects.

FIG. 11A represents a full input signal 1100 and non-predicative portion 1102 of the full input signal according to some aspects. As can be appreciated by examination FIG. 11A, the DR of the non-predicative portion 1102 is substantially lower than that of the full input signal 1100. In the example shown, the DR is reduced by about 40 decibels (dB). Accordingly if only the non-predicative portion 1102 is sampled by the apparatus 1000, then the dynamic range that needs to be sampled by the apparatus 1000 is substantially reduced relative to available systems. This allows the apparatus 1000 of aspects to maintain high sampling without needing to sample signals of a very high DR.

Figure 11B:
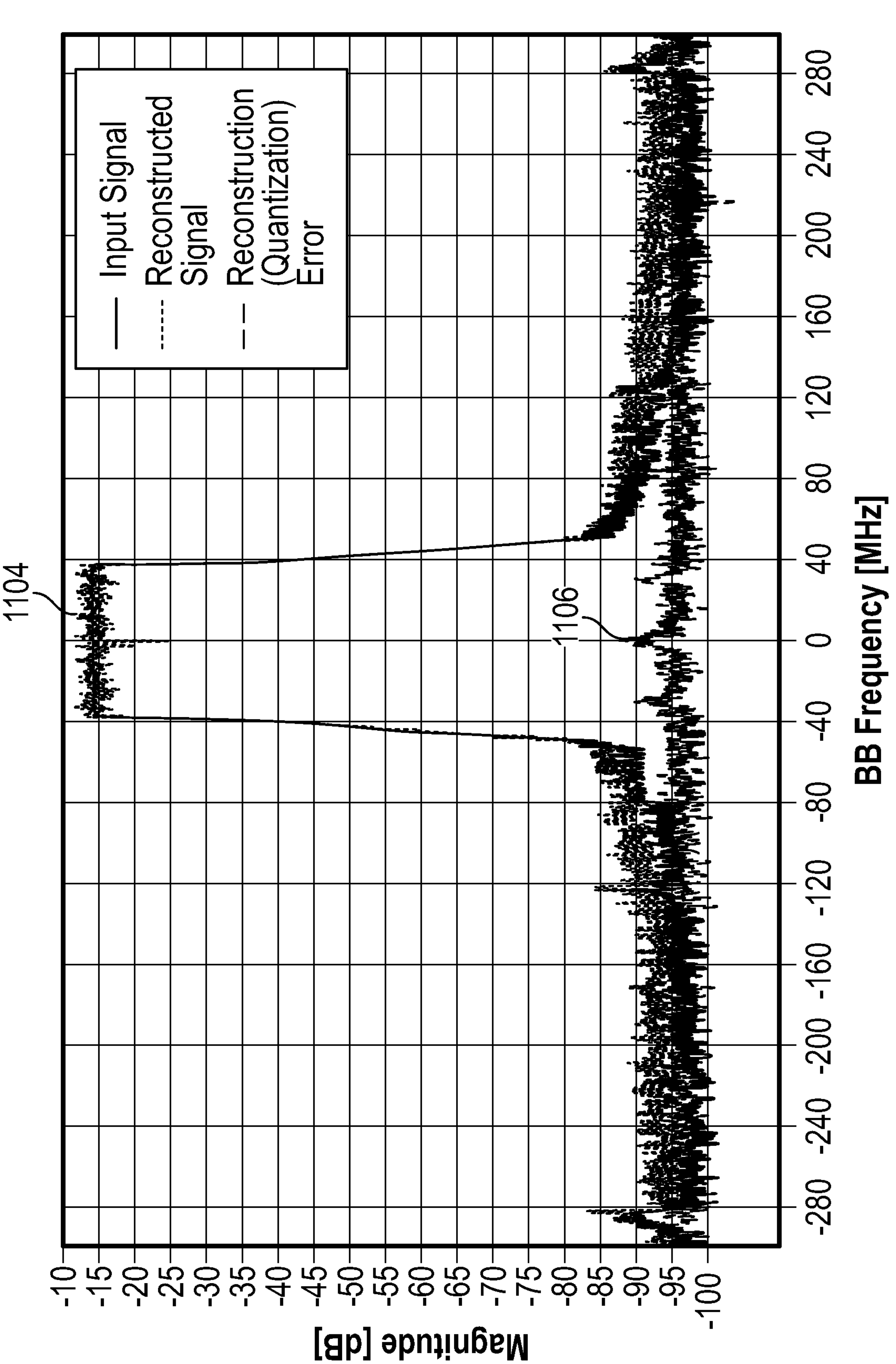
FIG. 11B illustrates a reconstructed signal such as a signal that can be reconstructed as an output by the apparatus.

FIG. 11B illustrates a reconstructed signal 1104 such as a signal that can be reconstructed as an output by the apparatus 1000. Signal 1106 is an error signal (e.g., "quantization floor") between the original input signal 1100 (FIG. 11A and the reconstructed output signal 1104). As can be appreciated by examination of FIG. 11B, the original input signal is nearly exactly reconstructed, with minimal error 1106.

Figure 12:
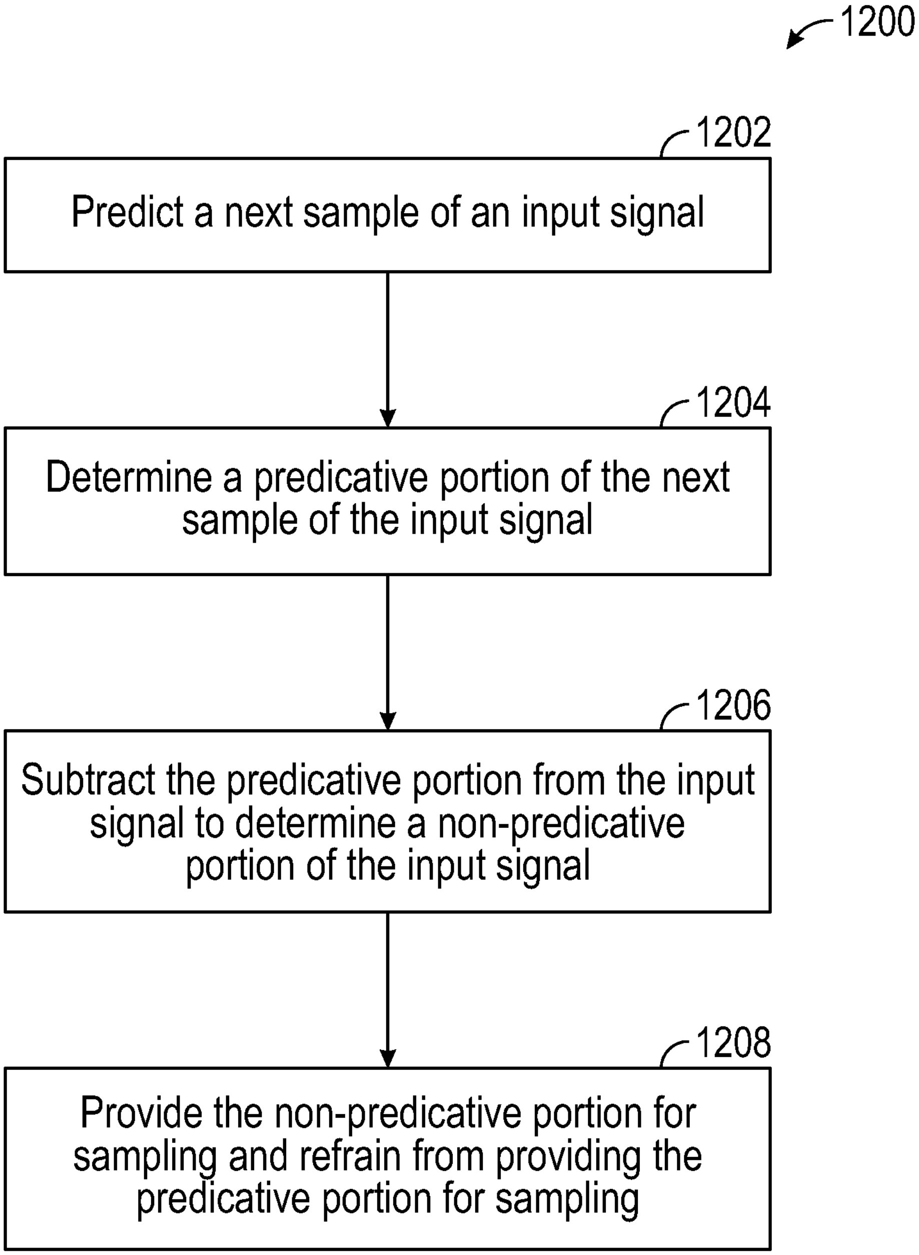
FIG. 12 illustrates a method for communicating in a wireless network according to some aspects.

FIG. 12 illustrates a method for communicating in a wireless network according to some aspects. The method 1200 can be performed by components of the apparatus 1000 (FIG. 10) or any communication component in FIGS. 1-9. The method 1200 can begin with operation 1202 by predicting a next sample of an input signal.

The method 1200 can continue with operation 1204 with determining a predicative portion of the next sample of the input signal. Operation 1204 can be performed using one or more of Equations (1)-(5), although aspects are not limited thereto. For example, operation 1204 can include determining the predicative portion based on a weighted history of the input signal.

The method 1200 can continue with operation 1206 by subtracting the predicative portion from the input signal to determine a non-predicative portion of the input signal. In some examples, the non-predicative portion can be based on an optimal linear prediction using an autocorrelation estimation of the input signal. The method 1200 can continue with operation 1208 with providing the non-predicative portion for sampling and refraining from providing the predicative portion for sampling.

By performing method 1200 according to some aspects, the apparatus 1000 can prevent ADC DR from becoming a bottleneck, by providing higher sample rates even for signals with high DR. The apparatus and methods according to aspects can reduce power consumption to alleviate the DR/power consumption tradeoff that can be present in available systems.

Other Systems and Apparatuses

Figure 13:
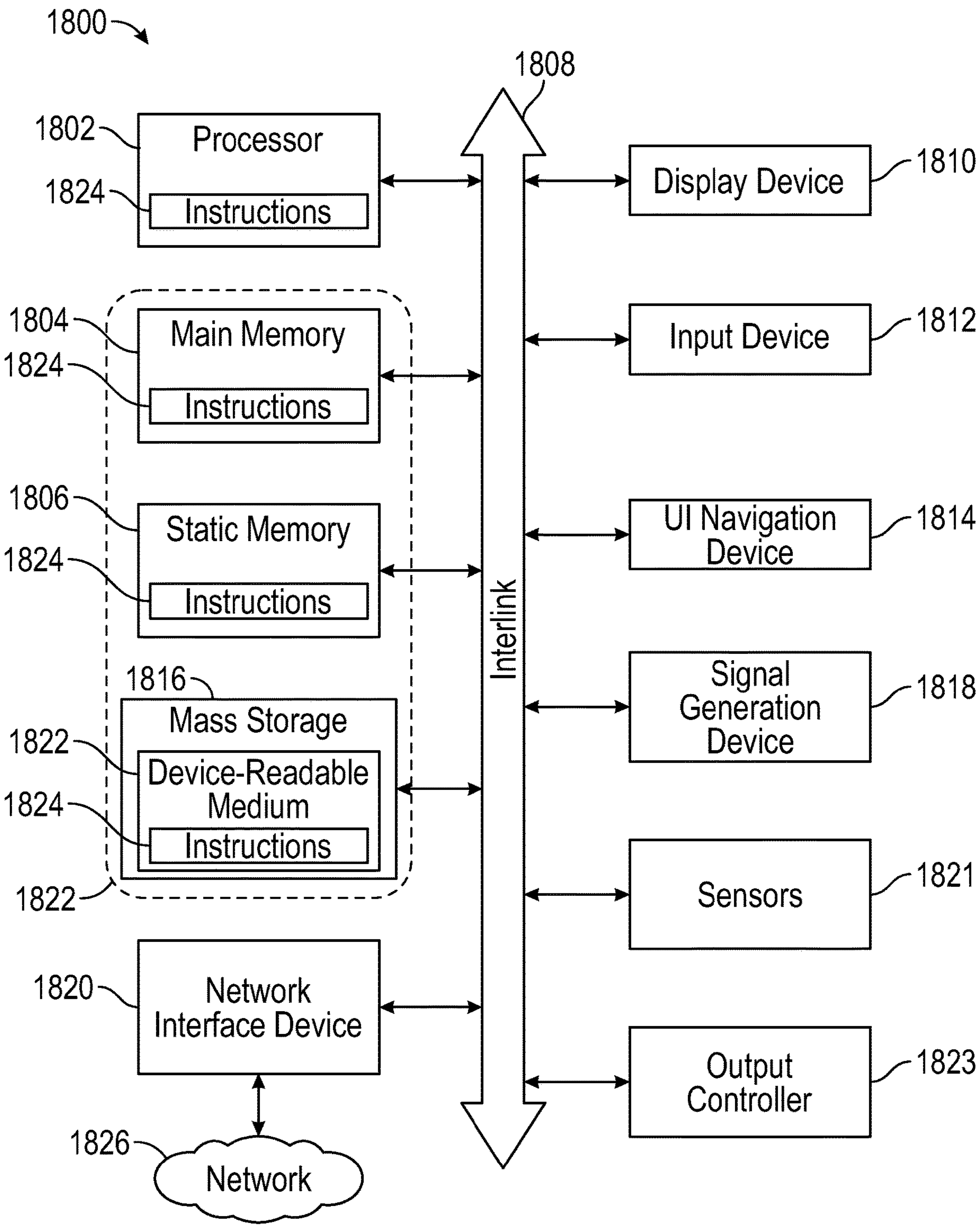
FIG. 13 illustrates a block diagram of a communication device such as an evolved Node-B (eNB), a new generation Node-B (gNB), an access point (AP), a wireless station (STA), a mobile station (MS), or a user equipment (UE), in accordance with some aspects.

FIG. 13 illustrates a block diagram of a communication device 1800 such as an evolved Node-B (eNB), a new generation Node-B (gNB), an access point (AP), a wireless station (STA), a mobile station (MS), or a user equipment (UE), in accordance with some aspects. In alternative aspects, the communication device 1800 may operate as a standalone device or may be connected (e.g., networked) to other communication devices. In some aspects, the communication device 1800 can use one or more of the techniques and circuits discussed herein, in connection with any of FIG. 1A-FIG. 12.

Circuitry (e.g., processing circuitry) is a collection of circuits implemented in tangible entities of the device 1800 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation.

In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the device 1800 follow.

In some aspects, the device 1800 may operate as a standalone device or may be connected (e.g., networked) to other devices. In a networked deployment, the communication device 1800 may operate in the capacity of a server communication device, a client communication device, or both in server-client network environments. In an example, the communication device 1800 may act as a peer communication device in peer-to-peer (P2P) (or other distributed) network environment. The communication device 1800 may be a UE, eNB, PC, a tablet PC, a STB, a PDA, a mobile telephone, a smart phone, a web appliance, a network router, switch or bridge, or any communication device capable of executing instructions (sequential or otherwise) that specify actions to be taken by that communication device. Further, while only a single communication device is illustrated, the term "communication device" shall also be taken to include any collection of communication devices that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a communication device-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Communication device (e.g., UE) 1800 may include a hardware processor 1802 (e.g., a central processing unit (CPU), a graphics processing unit (GPU), a hardware processor core, or any combination thereof), a main memory 1804, a static memory 1806, and mass storage device 1816 (e.g., hard drive, tape drive, flash storage, or other block or storage devices), some or all of which may communicate with each other via an interlink (e.g., bus) 1808.

The communication device 1800 may further include a display unit 1810, an alphanumeric input device 1812 (e.g., a keyboard), and a user interface (UI) navigation device 1814 (e.g., a mouse). In an example, the display unit 1810, input device 1812 and UI navigation device 1814 may be a touch screen display. The communication device 1800 may additionally include a signal generation device 1818 (e.g., a speaker), a network interface device 1820, and one or more sensors 1821, such as a global positioning system (GPS) sensor, compass, accelerometer, or another sensor. The communication device 1800 may include an output controller 1823, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The mass storage device 1816 may include a communication device-readable medium 1822, on which is stored one or more sets of data structures or instructions 1824 (e.g., software) embodying or utilized by any one or more of the techniques or functions described herein. In some aspects, registers of the processor 1802, the main memory 1804, the static memory 1806, and/or the mass storage device 1816 may be, or include (completely or at least partially), the device-readable medium 1822, on which is stored the one or more sets of data structures or instructions 1824, embodying or utilized by any one or more of the techniques or functions described herein. In an example, one or any combination of the hardware processor 1802, the main memory 1804, the static memory 1806, or the mass storage device 1816 may constitute the device-readable medium 1822.

As used herein, the term "device-readable medium" is interchangeable with "computer-readable medium" or "machine-readable medium". While the communication device-readable medium 1822 is illustrated as a single medium, the term "communication device-readable medium" may include a single medium or multiple media (e.g., a centralized or distributed database, and/or associated caches and servers) configured to store the one or more instructions 1824.

The term "communication device-readable medium" may include any medium that is capable of storing, encoding, or carrying instructions for execution by the communication device 1800 and that cause the communication device 1800 to perform any one or more of the techniques of the present disclosure, or that is capable of storing, encoding, or carrying data structures used by or associated with such instructions. Non-limiting communication device-readable medium examples may include solid-state memories, and optical and magnetic media. Specific examples of communication device-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, communication device-readable media may include non-transitory communication device-readable media. In some examples, communication device-readable media may include communication device-readable media that is not a transitory propagating signal.

The instructions 1824 may further be transmitted or received over a communications network 1826 using a transmission medium via the network interface device 1820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 1820 may include one or more physical jacks (e.g., Ethernet, coaxial, or phone jacks) or one or more antennas to connect to the communications network 1826. In an example, the network interface device 1820 may include a plurality of antennas to wirelessly communicate using at least one of single-input multiple-output (SIMO), MIMO, or multiple-input single-output (MISO) techniques. In some examples, the network interface device 1820 may wirelessly communicate using Multiple User MIMO techniques.

The term "transmission medium" shall be taken to include any intangible medium that is capable of storing, encoding, or carrying instructions for execution by the communication device 1800, and includes digital or analog communications signals or other intangible medium to facilitate communication of such software. In this regard, a transmission medium in the context of this disclosure is a device-readable medium.

Figure 14:
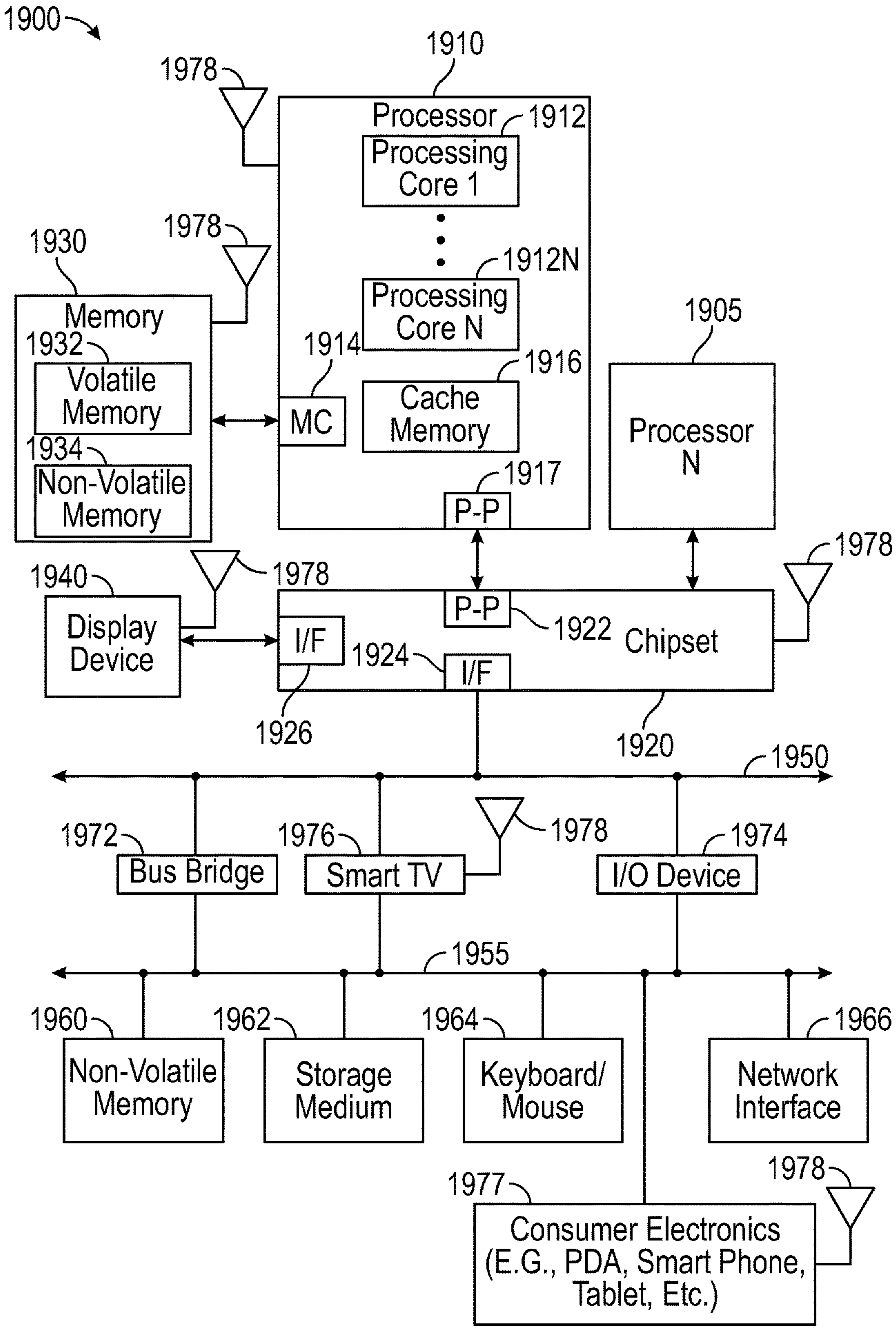
FIG. 14 illustrates a system level diagram, depicting an example of an electronic device (e.g., system) that can include, for example, a transmitter configured to selectively fan out a signal to one of multiple communication channels.

FIG. 14 illustrates a system level diagram, depicting an example of an electronic device (e.g., system) that can include, for example, a transmitter configured to selectively fan out a signal to one of multiple communication channels. FIG. 14 is included to show an example of a higher-level device application for the subject matter discussed above with regards to FIGS. 1-17. In one aspect, system 1900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some aspects, system 1900 is a system on a chip (SOC) system.

In one aspect, processor 1910 has one or more processor cores 1912, . . . , 1912N, where 1912N represents the Nth processor core inside processor 1910 where N is a positive integer. In one aspect, system 1900 includes multiple processors including 1910 and 1905, where processor 1905 has logic similar or identical to the logic of processor 1910. In some aspects, processing core 1912 includes, but is not limited to, pre-fetch logic to fetch instructions, decode logic to decode the instructions, execution logic to execute instructions and the like. In some aspects, processor 1910 has a cache memory 1916 to cache instructions and/or data for system 1900. Cache memory 1916 may be organized into a hierarchal structure including one or more levels of cache memory.

In some aspects, processor 1910 includes a memory controller 1914, which is operable to perform functions that enable the processor 1910 to access and communicate with memory 1930 that includes a volatile memory 1932 and/or a non-volatile memory 1934. In some aspects, processor 1910 is coupled with memory 1930 and chipset 1920. Processor 1910 may also be coupled to a wireless antenna 1978 to communicate with any device configured to transmit and/or receive wireless signals. In one aspect, an interface for wireless antenna 1978 operates in accordance with, but is not limited to, the IEEE 802.11 standard and its related family, Home Plug AV (HPAV), Ultra Wide Band (UWB), Bluetooth, WiMax, or any form of wireless communication protocol.

In some aspects, volatile memory 1932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1934 includes, but is not limited to, flash memory, phase change memory (PCM), read-only memory (ROM), electrically erasable programmable read-only memory (EEPROM), or any other type of non-volatile memory device.

Memory 1930 stores information and instructions to be executed by processor 1910. In one aspect, memory 1930 may also store temporary variables or other intermediate information while processor 1910 is executing instructions. In the illustrated aspect, chipset 1920 connects with processor 1910 via Point-to-Point (PtP or P-P) interfaces 1917 and 1922. Chipset 1920 enables processor 1910 to connect to other elements in system 1900. In some aspects of the example system, interfaces 1917 and 1922 operate in accordance with a PtP communication protocol such as the Intel® QuickPath Interconnect (QPI) or the like. In other aspects, a different interconnect may be used.

In some aspects, chipset 1920 is operable to communicate with processor 1910, 1905, display device 1940, and other devices, including a bus bridge 1972, a smart TV 1976, I/O devices 1974, nonvolatile memory 1960, a storage medium (such as one or more mass storage devices) 1962, a keyboard/mouse 1964, a network interface 1966, and various forms of consumer electronics 1977 (such as a PDA, smart phone, tablet etc.), etc. In one aspect, chipset 1920 couples with these devices through an interface 1924. Chipset 1920 may also be coupled to a wireless antenna 1978 to communicate with any device configured to transmit and/or receive wireless signals.

Chipset 1920 connects to display device 1940 via interface 1926. Display device 1940 may be, for example, a liquid crystal display (LCD), a plasma display, cathode ray tube (CRT) display, or any other form of visual display device. In some aspects of the example system, processor 1910 and chipset 1920 are merged into a single SOC. In addition, chipset 1920 connects to one or more buses 1950 and 1955 that interconnect various system elements, such as I/O devices 1974, nonvolatile memory 1960, storage medium 1962, a keyboard/mouse 1964, and network interface 1966. Buses 1950 and 1955 may be interconnected together via a bus bridge 1972.

In one aspect, storage medium 1962 includes, but is not limited to, a solid-state drive, a hard disk drive, a universal serial bus flash memory drive, or any other form of computer data storage medium. In one aspect, network interface 1966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one aspect, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 14 are depicted as separate blocks within the system 1900, the functions performed by some of these blocks may be integrated within a single semiconductor circuit or may be implemented using two or more separate integrated circuits. For example, although cache memory 1916 is depicted as a separate block within processor 1910, cache memory 1916 (or selected aspects of 1916) can be incorporated into processor core 1912.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "an example aspect", "some aspects", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to and are not intended to imply that the objects so described must be in a given sequence, either temporally, spatially, in ranking, or in any other manner.

Some aspects may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may, for example, be used in conjunction with devices and/or networks operating in accordance with existing IEEE 802.11 standards (including IEEE 802.11-2016 (IEEE 802.11-2016, IEEE Standard for Information technology—Telecommunications and information exchange between systems Local and metropolitan area networks--Specific requirements Part 11: Wireless LAN Medium Access Control (MAC) and Physical Layer (PHY) Specifications, Dec. 7, 2016); IEEE 802.11ay (P802.11ay Standard for Information Technology—Telecommunications and Information Exchange Between Systems Local and Metropolitan Area Networks—Specific Requirements Part 11: Wireless LAN Medium Access Control (MAC) and Physical Layer (PHY) Specifications—Amendment: Enhanced Throughput for Operation in License-Exempt Bands Above 45 GHz)) and/or future versions and/or derivatives thereof, devices and/or networks operating in accordance with existing WiFi Alliance (WFA) Peer-to-Peer (P2P) specifications (including WiFi P2P technical specification, version 1.5, Aug. 4, 2015) and/or future versions and/or derivatives thereof, devices and/or networks operating in accordance with existing Wireless-Gigabit-Alliance (WGA) specifications (including Wireless Gigabit Alliance, Inc WiGig MAC and PHY Specification Version 1.1, April 2011, Final specification) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some aspects may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth, Global Positioning System (GPS), Wi-Fi, Wi-Max, ZigBeeTM, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that is integrated with a computer, or a peripheral that is attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting and/or the action of receiving. In one example, the phrase "communicating a signal" may refer to the action of transmitting the signal by a first device and may not necessarily include the action of receiving the signal by a second device. In another example, the phrase "communicating a signal" may refer to the action of receiving the signal by a first device and may not necessarily include the action of transmitting the signal by a second device.

Some demonstrative aspects may be used in conjunction with a wireless communication network communicating over a frequency band above 45 Gigahertz (GHz), e.g., 60 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a frequency band above 45 GHz, a frequency band below 20 GHz, e.g., a Sub 1 GHz (S1G) band, a 2.4 GHz band, a 5 GHz band, a WLAN frequency band, a WPAN frequency band, a frequency band according to the WGA specification, and the like.

As used herein, the term "circuitry" may, for example, refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, circuitry may include logic, at least partially operable in hardware. In some aspects, the circuitry may be implemented as part of and/or in the form of a radio virtual machine (RVM), for example, as part of a Radio processor (RP) configured to execute code to configured one or more operations and/or functionalities of one or more radio components.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna" or "antenna array", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

ADDITIONAL NOTES AND ASPECTS

Example 1 is an apparatus comprising sampling circuitry; and processing circuitry coupled to the sampling circuitry, the processing circuitry configured to: predict a next sample of an input signal; determine a predicative portion of the next sample of the input signal; subtract the predicative portion from the input signal to determine a non-predicative portion of the input signal; and provide the non-predicative portion to the sampling circuitry, the sampling circuitry configured to sample the non-predicative portion.

In Example 2, the subject matter of Example 1 can optionally include wherein the predicative portion is determined based on a weighted history of the input signal.

In Example 3, the subject matter of any of Examples 1-2 can optionally include wherein the non-predicative portion of the input signal is determined based on an optimal linear prediction.

In Example 4, the subject matter of Example 3 can optionally include wherein the optimal linear prediction is based on autocorrelation estimation of the input signal.

In Example 5, the subject matter of any of Examples 1-4 can optionally include wherein the processing circuitry is configured to refrain from providing the predicative portion of the next sample of the input signal for sampling.

In Example 6, the subject matter of any of Examples 1-5 can optionally include wherein the processing circuitry is configured to reconstruct an output signal similar to the input signal.

In Example 7 the subject matter of Example 6 can optionally include wherein the processing circuitry is configured to reconstruct the output signal using an inverse filter.

In Example 8, the subject matter of any of Examples 1-7 can optionally include wherein the sampling circuitry comprises an analog to digital converter.

In Example 9, the subject matter of Example 8 can optionally include wherein the sampling circuitry is included in a successive-approximation ADC.

Example 10 is a wireless communication device comprising: one or more antennas; and transceiver circuitry comprising: sampling circuitry; and processing circuitry coupled to the sampling circuitry, the processing circuitry configured to: predict a next sample of an input signal; determine a predicative portion of the next sample of the input signal; subtract the predicative portion from the input signal to determine a non-predicative portion of the input signal; and provide the non-predicative portion to the sampling circuitry, the sampling circuitry configured to sample the non-predicative portion.

In Example 11, the subject matter of Example 10 can optionally include wherein the predicative portion is determined based on a weighted history of the input signal.

In Example 12, the subject matter of any of Examples 10-11 can optionally include wherein the non-predicative portion of the input signal is determined based on an optimal linear prediction.

In Example 13, the subject matter of Example 12 can optionally include wherein the optimal linear prediction is based on autocorrelation estimation of the input signal.

In Example 14, the subject matter of any of Examples 10-13 can optionally include wherein the processing circuitry is configured to reconstruct an output signal similar to the input signal.

In Example 15, the subject matter of any of Examples 10-14 can optionally include wherein the processing circuitry is configured to reconstruct a signal to be output using an inverse filter.

In Example 16, the subject matter of any of Examples 10-15 can optionally include wherein the sampling circuitry comprises an analog to digital converter.

In Example 17, the subject matter of Example 16 can optionally include wherein the sampling circuitry is included in a successive-approximation ADC.

Example 18 is a method for communicating in a wireless network, the method comprising: predicting a next sample of an input signal; determining a predicative portion of the next sample of the input signal; subtracting the predicative portion from the input signal to determine a non-predicative portion of the input signal; and providing the non-predicative portion for sampling and refraining from providing the predicative portion for sampling.

In Example 19, the subject matter of Example 18 can optionally include determining the predicative portion based on a weighted history of the input signal.

In Example 20, the subject matter of any of Examples 18-19 can optionally include determining the predicative portion based on a weighted history of the input signal.

The above detailed description includes references to the accompanying drawings, which form a part of the detailed description. The drawings show, by way of illustration, specific aspects in which the invention can be practiced. These aspects are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect, and it is contemplated that such aspects can be combined with each other in various combinations or permutations. The scope of the invention should be determined with reference to the appended claims, along with the full scope of equivalents to which such claims are legally entitled.

What is claimed is:

1. An apparatus comprising:
- sampling circuitry; and
- processing circuitry coupled to the sampling circuitry, the processing circuitry configured to:
  - predict a next sample of an input signal;
  - determine a predicative portion of the next sample of the input signal, based on a weighted history of the input signal;
  - subtract the predicative portion from the input signal to determine a non-predicative portion of the input signal; and
  - provide the non-predicative portion to the sampling circuitry, the sampling circuitry configured to sample the non-predicative portion.

2. The apparatus of claim 1, wherein the non-predicative portion of the input signal is determined based on an optimal linear prediction.

3. The apparatus of claim 2, wherein the optimal linear prediction is based on autocorrelation estimation of the input signal.

4. The apparatus of claim 1, wherein the processing circuitry is configured to refrain from providing the predicative portion of the next sample of the input signal for sampling.

5. The apparatus of claim 1, wherein the processing circuitry is configured to reconstruct an output signal similar to the input signal.

6. The apparatus of claim 5, wherein the processing circuitry is configured to reconstruct the output signal using an inverse filter.

7. The apparatus of claim 1, wherein the sampling circuitry comprises an analog-to-digital converter.

8. The apparatus of claim 7, wherein the sampling circuitry is included in a successive-approximation ADC.

9. A wireless communication device comprising:
- one or more antennas; and
- transceiver circuitry comprising:
  - sampling circuitry; and
  - processing circuitry coupled to the sampling circuitry, the processing circuitry configured to:
    - predict a next sample of an input signal;
    - determine a predicative portion of the next sample of the input signal, based on a weighted history of the input signal;
    - subtract the predicative portion from the input signal to determine a non-predicative portion of the input signal; and
    - provide the non-predicative portion to the sampling circuitry, the sampling circuitry configured to sample the non-predicative portion.

10. The wireless communication device of claim 9, wherein the non-predicative portion of the input signal is determined based on an optimal linear prediction.

11. The wireless communication device of claim 10, wherein the optimal linear prediction is based on autocorrelation estimation of the input signal.

12. The wireless communication device of claim 9, wherein the processing circuitry is configured to reconstruct an output signal similar to the input signal.

13. The wireless communication device of claim 9, wherein the processing circuitry is configured to reconstruct a signal to be output using an inverse filter.

14. The wireless communication device of claim 9, wherein the sampling circuitry comprises an analog-to-digital converter.

15. The wireless communication device of claim 14, wherein the sampling circuitry is included in a successive-approximation ADC.

16. A method for communicating in a wireless network, the method comprising:
- predicting a next sample of an input signal;
- determining a predicative portion of the next sample of the input signal, based on a weighted history of the input signal;

subtracting the predicative portion from the input signal to determine a non-predicative portion of the input signal; and providing the non-predicative portion for sampling and refraining from providing the predicative portion for sampling.

17. The method of claim 16, further comprising determining the non-predicative portion of the input signal based on an optimal linear prediction using an autocorrelation estimation indication of the input signal.

* * * * *